(12) United States Patent
Kim et al.

(10) Patent No.: US 11,894,392 B2
(45) Date of Patent: Feb. 6, 2024

(54) TRANSPARENT DISPLAY DEVICE

(71) Applicant: LG Display Co., Ltd., Seoul (KR)

(72) Inventors: EuiTae Kim, Paju-si (KR); KiSeob Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 335 days.

(21) Appl. No.: 17/130,988

(22) Filed: Dec. 22, 2020

(65) Prior Publication Data

US 2021/0202532 A1   Jul. 1, 2021

(30) Foreign Application Priority Data

Dec. 27, 2019   (KR) .................. 10-2019-0176455

(51) Int. Cl.
  *H01L 27/14*  (2006.01)
  *H01L 27/12*  (2006.01)
  *H10K 59/121*  (2023.01)
  *H10K 59/131*  (2023.01)

(52) U.S. Cl.
  CPC .......... *H01L 27/124* (2013.01); *H10K 59/121* (2023.02); *H10K 59/131* (2023.02)

(58) Field of Classification Search
  CPC .. H01L 27/124; H10K 59/121; H10K 59/131; H10K 59/12; H10K 50/813; H10K 50/82; H10K 59/00; H10K 50/80
  USPC .................................................... 257/59, 72
  See application file for complete search history.

(56) References Cited

U.S. PATENT DOCUMENTS

| | | | |
|---|---|---|---|
| 9,368,754 B2 * | 6/2016 | Kim | H10K 50/854 |
| 9,917,280 B2 * | 3/2018 | Seo | H01L 51/5271 |
| 10,236,327 B2 | 3/2019 | Choe et al. | |
| 10,510,813 B2 | 12/2019 | Son et al. | |
| 10,593,905 B2 | 3/2020 | Lee et al. | |
| 10,861,371 B2 | 12/2020 | Choi et al. | |
| 2016/0218157 A1 * | 7/2016 | Ahn | H10K 59/122 |
| 2019/0267363 A1 | 8/2019 | Bower et al. | |

(Continued)

FOREIGN PATENT DOCUMENTS

| | | |
|---|---|---|
| CN | 106935619 A | 7/2017 |
| CN | 106992198 A | 7/2017 |
| CN | 108010938 A | 5/2018 |

(Continued)

*Primary Examiner* — Tan N Tran
(74) *Attorney, Agent, or Firm* — Seed IP Law Group LLP

(57) ABSTRACT

A transparent display device is disclosed, which may have high light transmittance in a non-display area as well as a display area, and may increase or maximize a light emission area in a non-transmissive area. The transparent display device comprises a substrate provided with a display area, in which a plurality of subpixels are disposed, and a non-display area adjacent to the display area, anode electrodes provided in each of the plurality of subpixels over the substrate, a light emitting layer provided over the anode electrodes, a cathode electrode provided over the light emitting layer, a pixel power line provided over the substrate and extended in the display area in a first direction, and a common power line provided over the substrate and extended in the display area in the first direction. The display area includes a non-transmissive area provided with the common power line and the pixel power line, and a transmissive area provided between the common power line and the pixel power line.

15 Claims, 15 Drawing Sheets

(56) References Cited

U.S. PATENT DOCUMENTS

2019/0341439 A1   11/2019   Choi et al.

FOREIGN PATENT DOCUMENTS

| CN | 108254954 A | | 7/2018 |
|---|---|---|---|
| CN | 110021711 A | * | 7/2019 |
| CN | 110444563 A | | 11/2019 |
| KR | 10-2017-0079978 A | | 7/2017 |
| KR | 10-1801912 B1 | | 12/2017 |
| KR | 10-2018-0076496 A | | 7/2018 |
| KR | 10-2019-0079998 A | | 7/2019 |

* cited by examiner

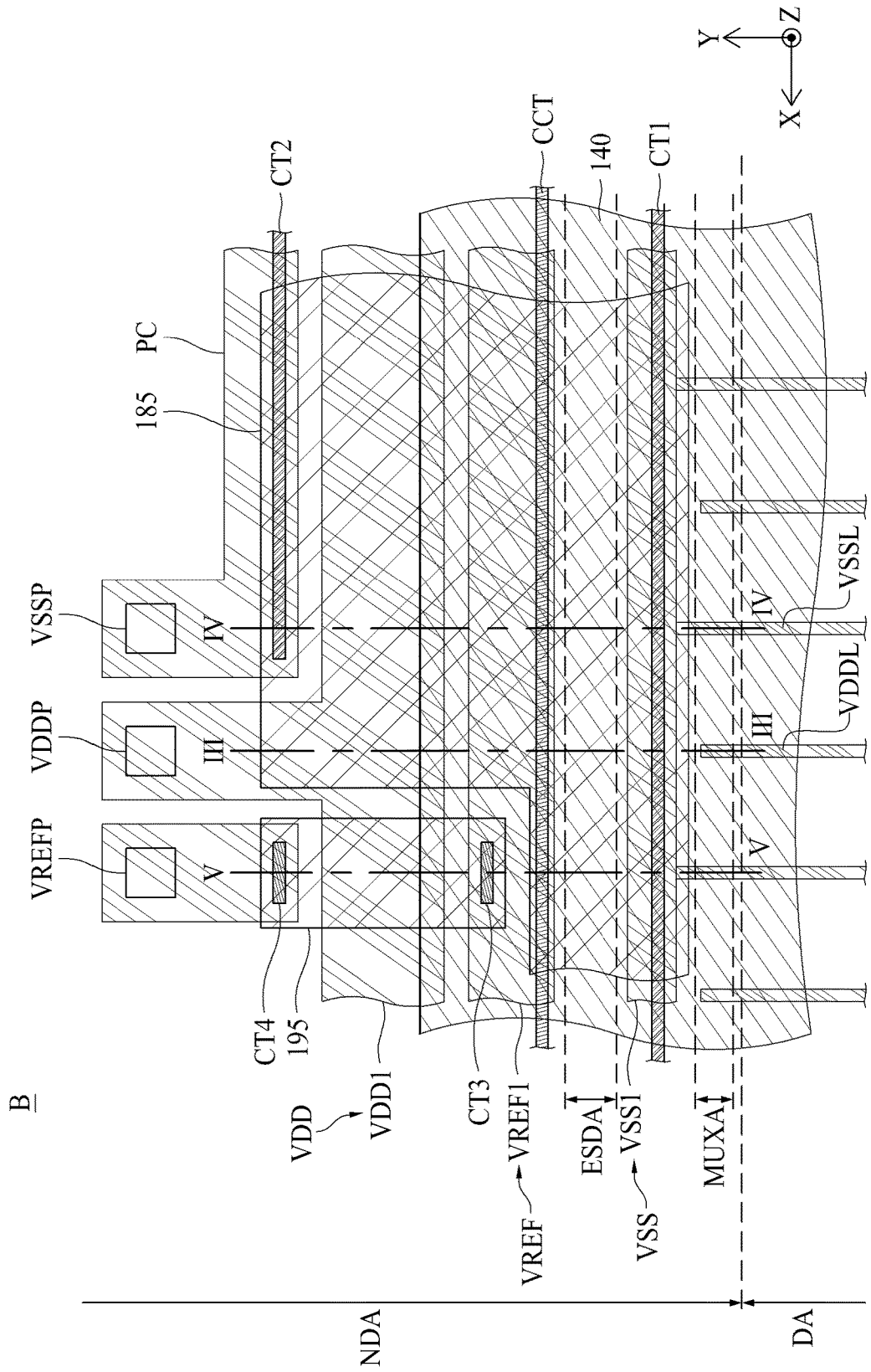

TRANSPARENT DISPLAY DEVICE

CROSS REFERENCE TO RELATED APPLICATION

This application claims priority from Korean Patent Application No. 10-2019-0176455, filed on Dec. 27, 2019, which is hereby incorporated by reference for all purposes as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device may include a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors of the present disclosure recognized that the transparent display device has lower light transmittance in the non-display area than the display area as a plurality of signal lines are disposed in the non-display area. One or more embodiments of the present disclosure has been made in view of the problems in the related art including the above problems identified by the inventors.

Accordingly, one or more embodiments of the present disclosure provides a transparent display device that may have high light transmittance in a non-display area as well as a display area.

Further embodiments of the present disclosure provides a transparent display device that may increase or maximize a light emission area in a non-transmissive area.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a substrate provided with a display area, in which a plurality of subpixels are disposed, and a non-display area adjacent to the display area, anode electrodes provided in each of the plurality of subpixels on the substrate, a light emitting layer provided on the anode electrodes, a cathode electrode provided on the light emitting layer, a pixel power line provided on the substrate and extended in the display area in a first direction, and a common power line provided on the substrate and extended in the display area in the first direction. The display area includes a non-transmissive area provided with the common power line and the pixel power line, and a transmissive area provided between the common power line and the pixel power line. In one embodiment, the non-display area is positioned surrounding the display area, but this is not required.

In accordance with another aspect of the present disclosure, the above and other benefits can be accomplished by the provision of a transparent display device comprising a substrate provided with a display area, in which a plurality of subpixels are disposed, and a non-display area adjacent to the display area, a common power line provided on the substrate and extended in the display area in a first direction, a plurality of first anode electrodes provided on the common power line along the common power line, a bank provided among the plurality of first anode electrodes, and a spacer provided on the bank.

According to the present disclosure, the common power lines and the pixel power lines may alternately be disposed in the display area, and the transmissive area may be provided between the common power line and the pixel power line. Also, a first subpixel may be provided in an area where a gate line and the common power line cross each other, and a third subpixel may be provided in an area where the gate line and the pixel power line cross each other, and a second subpixel may be provided between the first subpixel and the third subpixel. Therefore, the present disclosure may improve transmittance by increasing or maximizing the transmissive area.

Also, according to the present disclosure, the anode electrode provided in each of the first and third subpixels may include a first portion, a second portion protruded from one side of the first portion, and a third portion protruded from the other side of the first portion. At this time, the second portion and the third portion may prevent diffraction from occurring due to a plurality of metal lines by overlaying the metal lines provided therebelow.

Also, according to the present disclosure, the second portion and the third portion may be formed in the anode electrode provided in each of the first and third subpixels, whereby an area of a light emission area may be increased or maximized in the non-transmissive area.

Also, according to the present disclosure, a spacer may be provided without decrease of an area of the light emission area. Also, a mask may be disposed on the spacer in the process of forming a light emitting layer, whereby the light emitting layer may accurately be patterned, and elements formed on a first substrate may be prevented from being damaged by the mask.

Also, according to the present disclosure, a cathode electrode is formed of a low resistance metal material, whereby a separate cathode auxiliary electrode and a separate cathode contact structure may not be formed. Therefore, an area of the transmissive area may be increased or maximized, and an area of the light emission area in the non-transmissive area may be increased or maximized.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which:

FIG. 8 is an enlarged view of an area B in FIG. 2;

DETAILED DESCRIPTION DISCLOSURE

Figure 1:
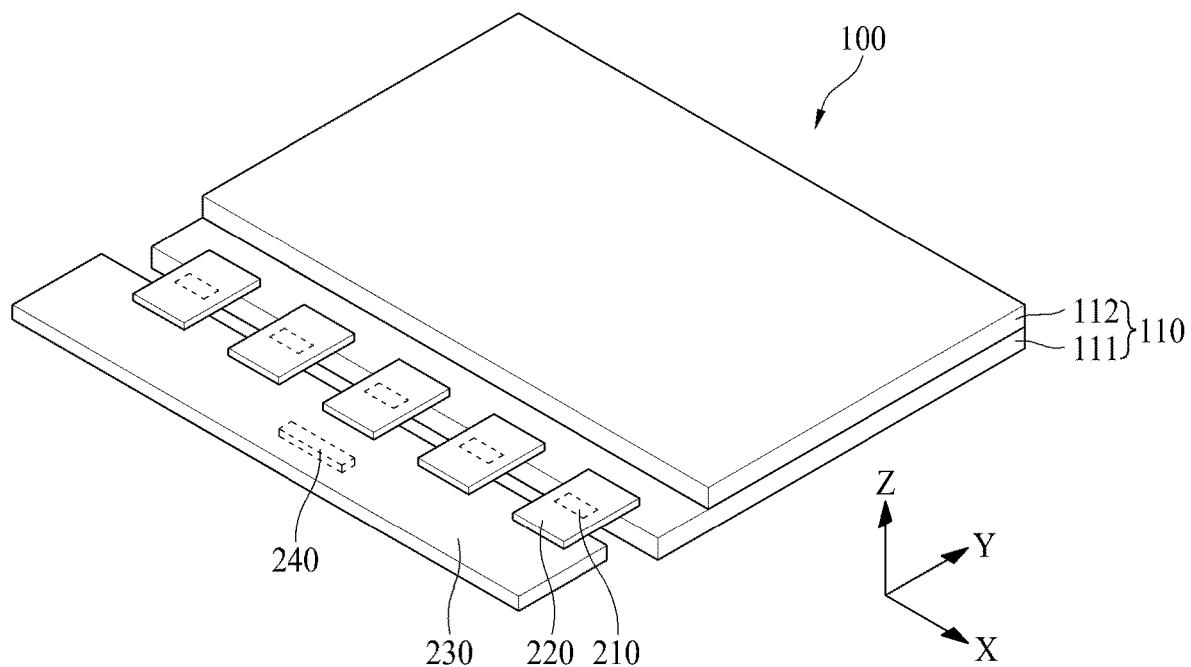
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device (LCD), a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The gate driver supplies gate signals to the gate lines in accordance with a gate control signal which is provided from the timing controller 240. The gate driver may be provided in the non-display area outside one side of the display area of the transparent display panel 110, or both sides of the transparent display panel 110 by a gate driver in panel (GIP) method. In another way, the gate driver may be manufactured in a driving chip, may be mounted on the flexible film, and may be attached to the non-display area outside one side of the display area of the transparent display panel 110, or both sides of the transparent display panel 110 by a tape automated bonding (TAB) method.

The source drive IC 210 receives digital video data and source control signals from the timing controller 240. The source drive IC 210 converts the digital video data into analog data voltages in accordance with the source control signal, and supplies the analog data voltages to the data lines. If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in a non-display area of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
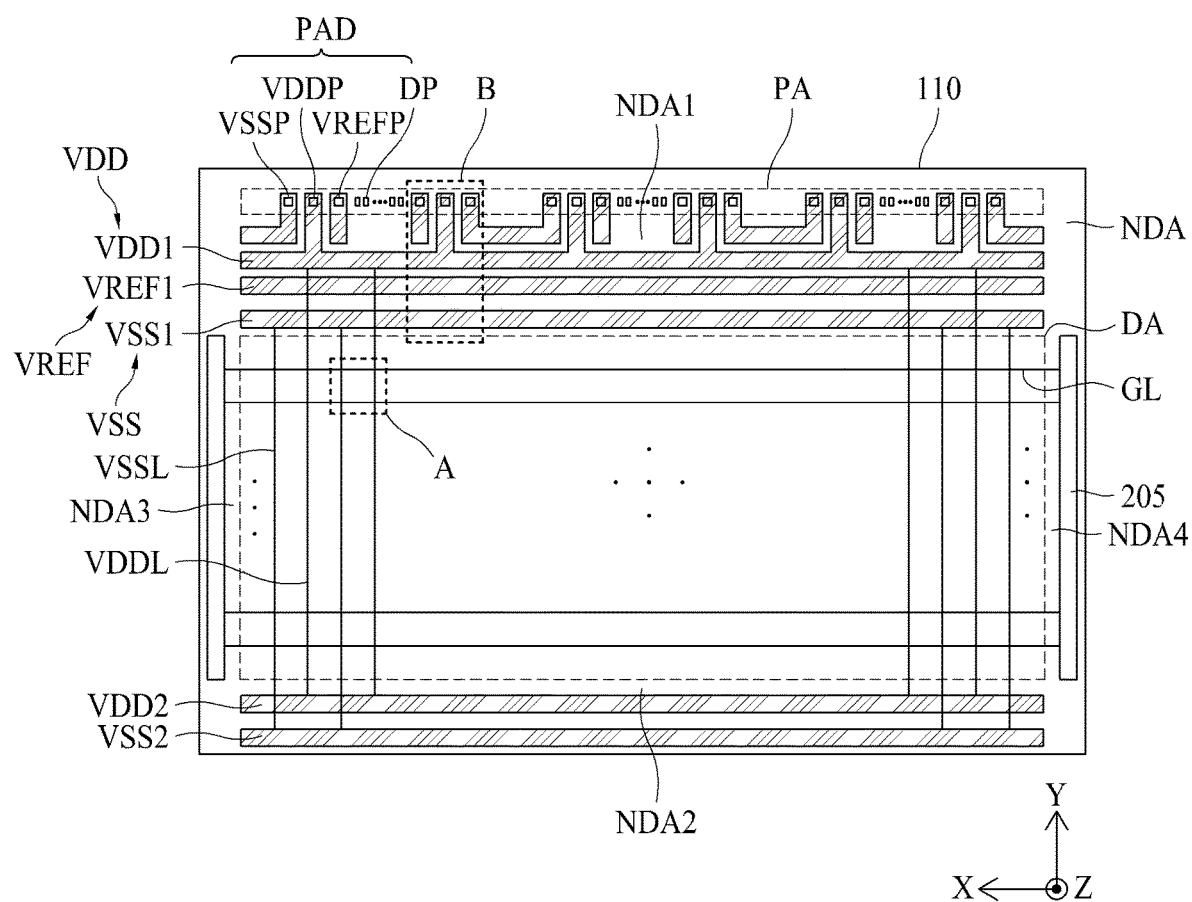
FIG. 2 is a schematic plane view illustrating a transparent display panel.
Figure 3:
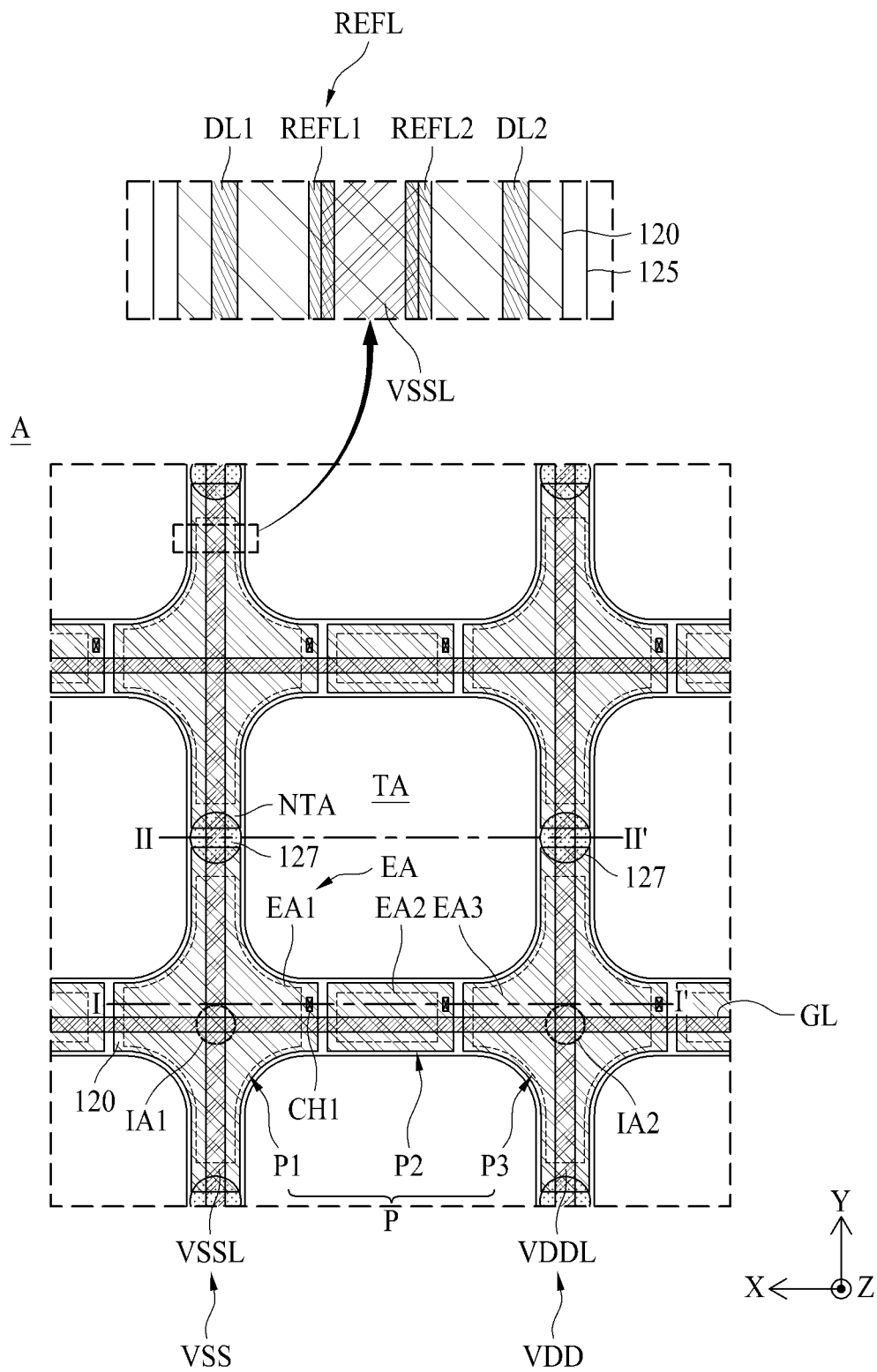
FIG. 3 is an enlarged view of an area A in FIG. 2.
Figure 4:
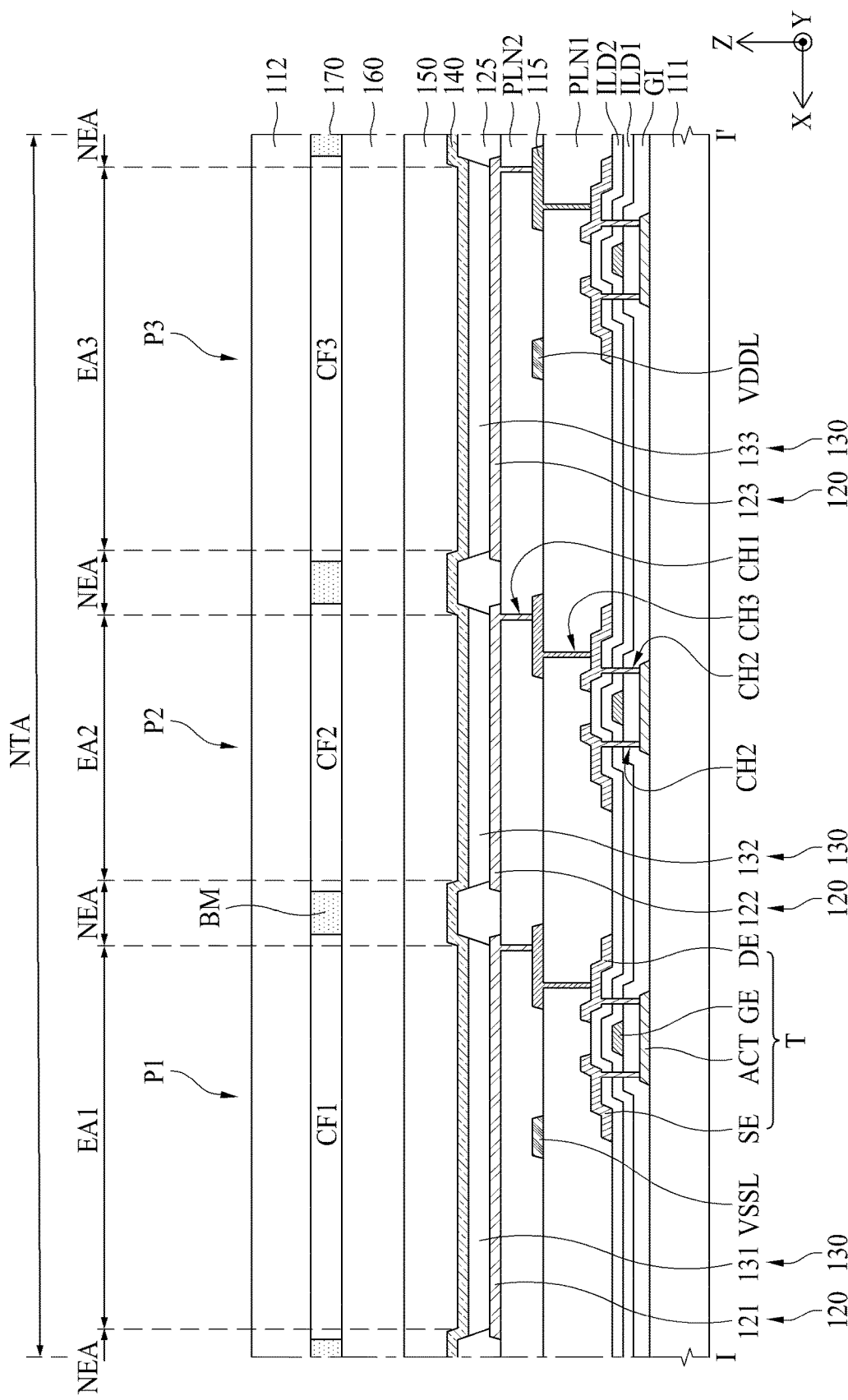
FIG. 4 is a cross-sectional view taken along line I-I' of FIG. 3.
Figure 5:
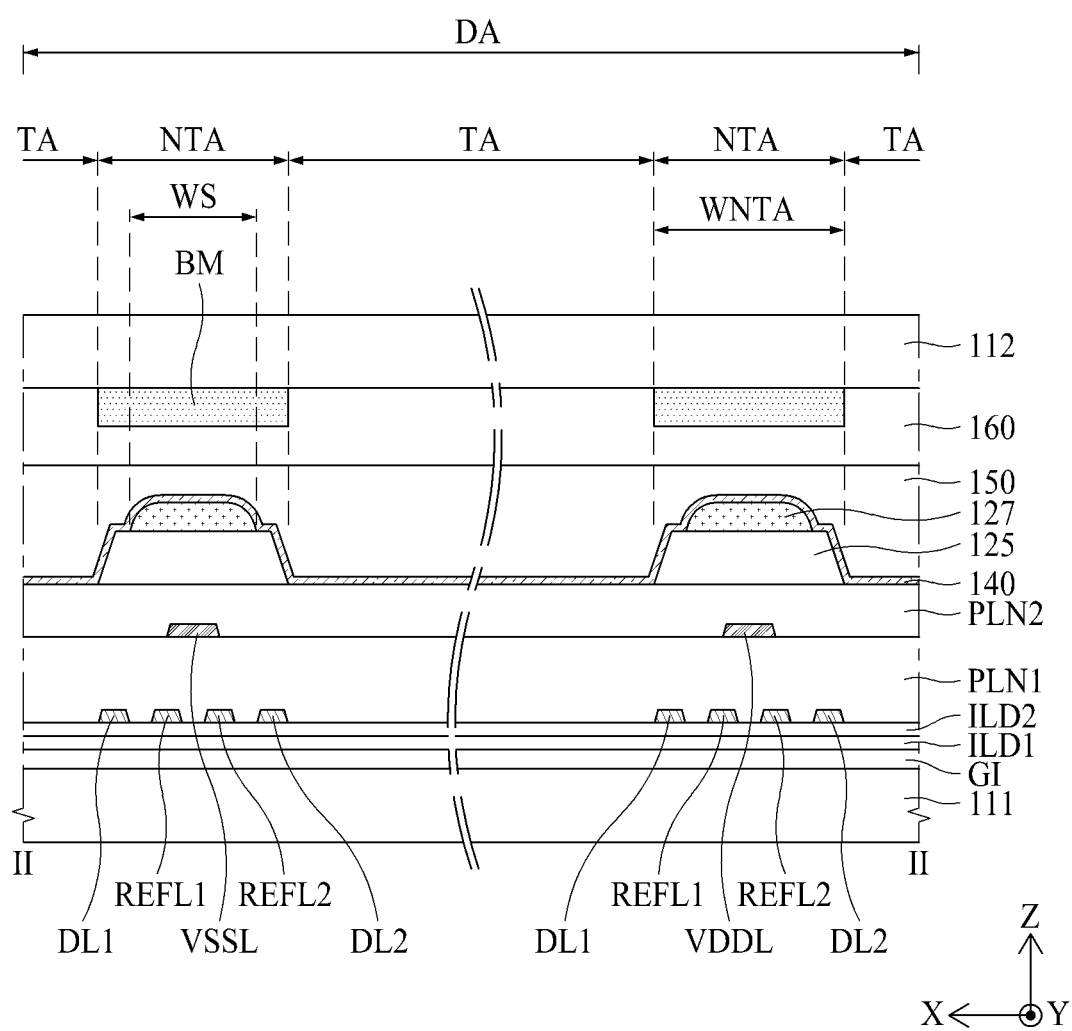
FIG. 5 is a cross-sectional view taken along line II-II' of FIG. 3.
Figure 6A:
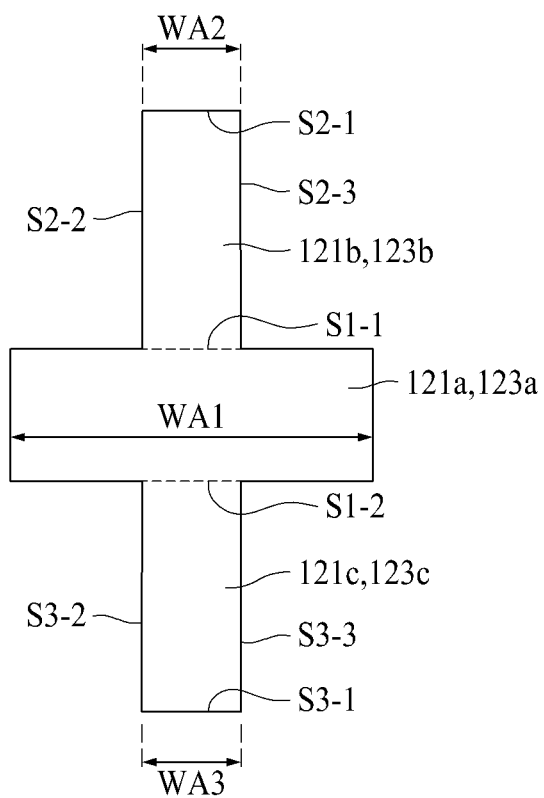
FIGS. 6A to 6D are views illustrating shapes of first, second and third anode electrodes.
Figure 6B:
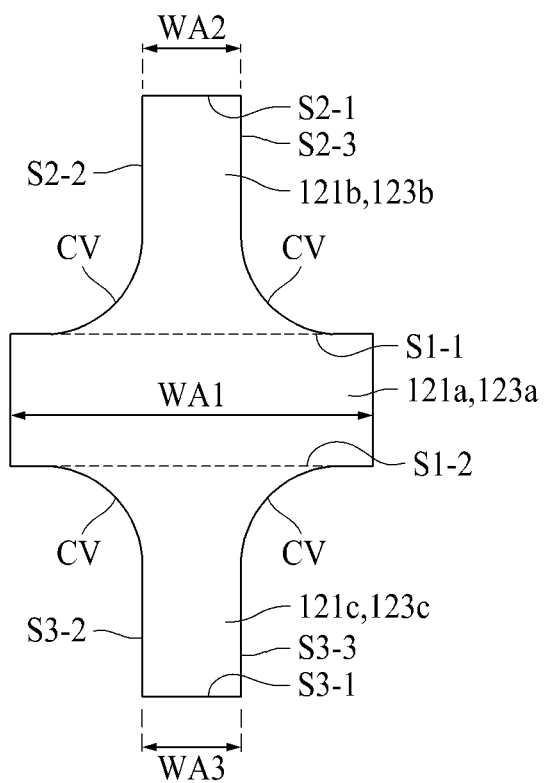
Figure 6C:
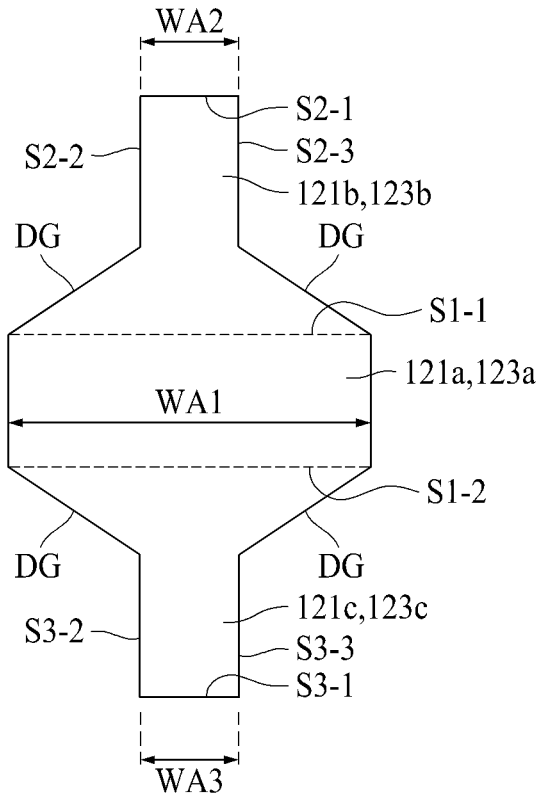
Figure 6D:
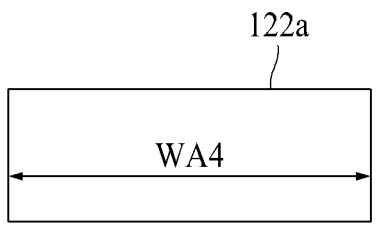
Figure 7A:
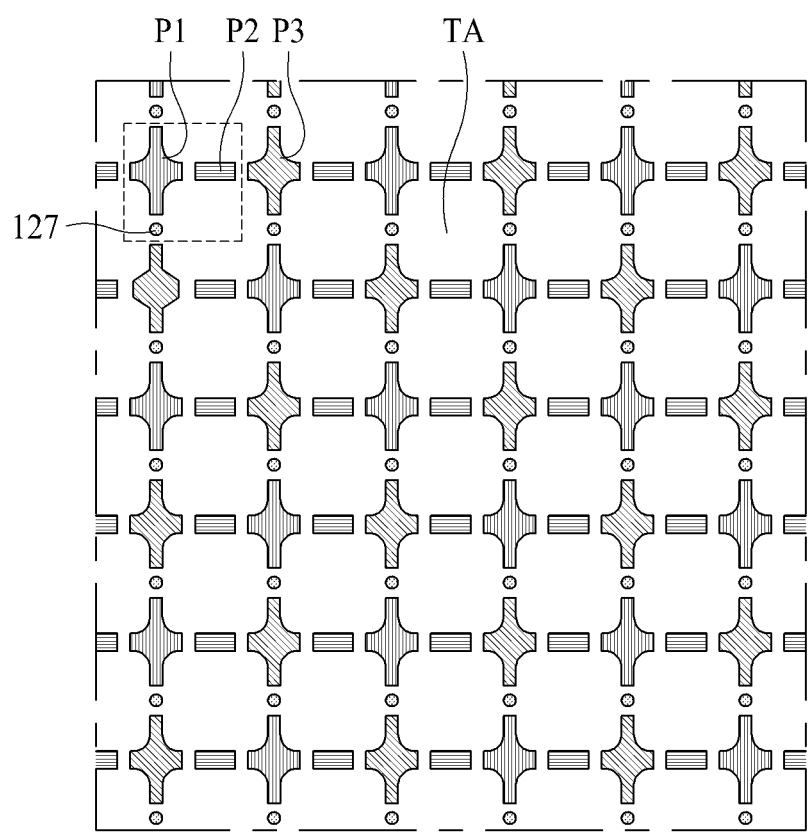
FIGS. 7A to 7C are views illustrating embodiments of arrangement of a spacer.
Figure 7B:
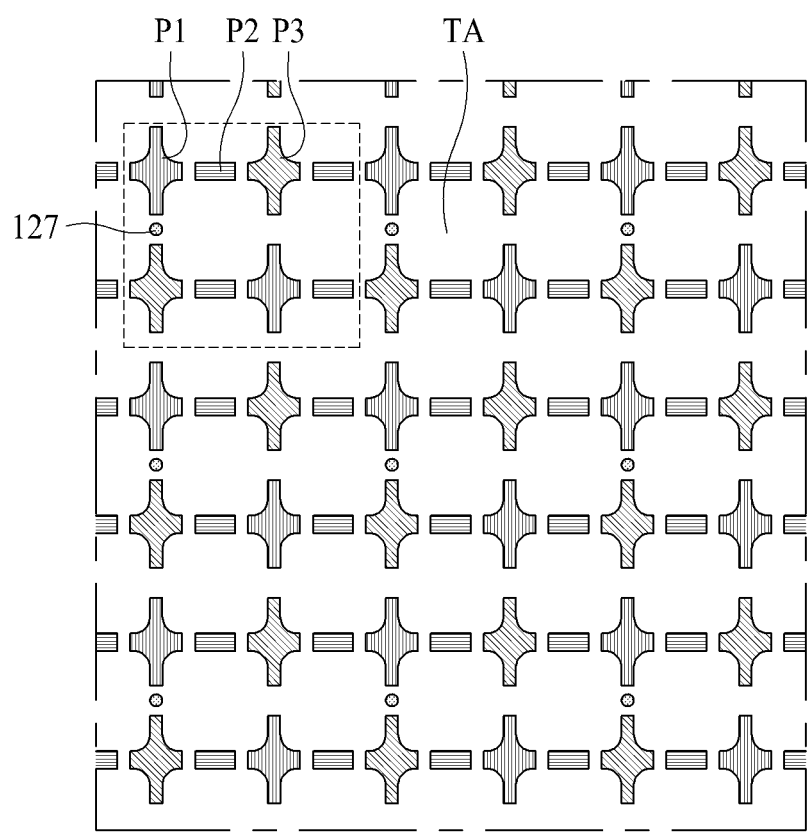
Figure 7C:
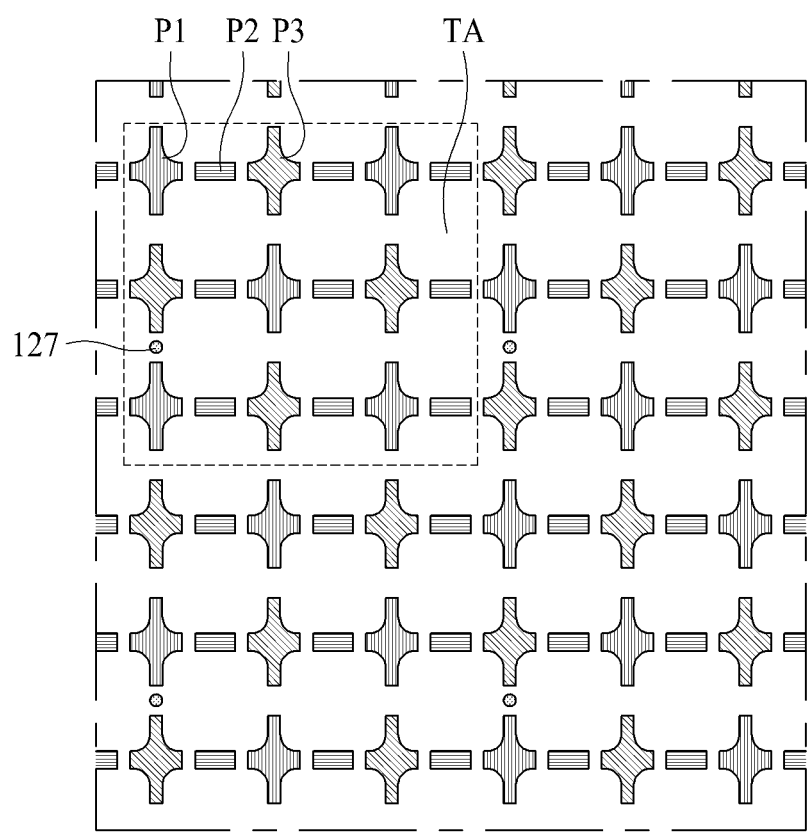

FIG. 2 is a schematic plane view illustrating a transparent display panel, FIG. 3 is an enlarged view of an area A in FIG. 2, FIG. 4 is a cross-sectional view taken along line I-I' of FIG. 3, FIG. 5 is a cross-sectional view taken along line II-II' of FIG. 3, FIGS. 6A to 6D are views illustrating shapes of first, second and third anode electrodes, and FIGS. 7A to 7C are views illustrating embodiments of arrangement of a spacer.

The first substrate 111 may include a display area DA where pixels P are formed to display an image, and a non-display area NDA that does not display an image.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, 90%, and the non-transmissive area NTA may be an area where light transmittance is smaller than β%, for example, 50%. At this time, α is greater than β. A user may view an object or background arranged behind the transparent display panel 110 due to the transmissive area TA.

The non-transmissive area NTA may be provided with pixel power lines VDD(VDDL), common power lines VSS (VSSL), reference lines, data lines, gate lines GL, and pixels P.

The gate lines GL may be extended in a first direction (e.g., X axis direction), and may cross (or overlap) the pixel power lines VDD(VDDL), the common power lines VSS (VSSL) and the data lines in the display area DA.

The pixel power lines VDD(VDDL), the common power lines VSS(VSSL), the reference lines and the data lines may be extended in a second direction (e.g., Y axis direction). At this time, the pixel power lines VDD(VDDL) and the common power lines VSS(VSSL) may alternately be disposed in the display area DA. The transmissive area TA may be disposed between the pixel power line VDD(VDDL) and the common power line VSS(VSSL).

The pixels P emit predetermined light to display an image. An emission area EA may correspond to an area, from which light emits, in the pixel P.

Each of the pixels P may include a first subpixel P1, a second subpixel P2, and a third subpixel P3. The first subpixel P1 may be provided to include a first emission area EA1 emitting green light, the second subpixel P2 may be provided to include a second emission area EA2 emitting red light, and the third subpixel P3 may be provided to include a third emission area EA3 emitting blue light, but these subpixel are not limited thereto. Each of the pixels P may further include a subpixel emitting white light W. An arrangement sequence of the subpixel P1, P2 and P3 may be changed in various ways.

Hereinafter, for convenience of description, a description will be given based on that the first subpixel P1 is a green subpixel emitting green light, the second subpixel P2 is a red subpixel emitting red light, and the third subpixel P3 is a blue subpixel emitting blue light.

Each of the first subpixel P1 and the third subpixel P3 may be disposed to overlap any one of a first overlapping area IA1 where the common power line VSSL and the gate line GL cross each other and a second overlapping area IA2 where the pixel power line VDDL and the gate line GL cross each other.

For example, at least a part of the first subpixel P1, as shown in FIG. 3, may be disposed to overlap the first overlapping area IA1 where the common power line VSSL and the gate line GL cross each other, but is not limited thereto. At least a part of the third subpixel P3 may be disposed to overlap the second overlapping area IA2 where the pixel power line VDDL and the gate line GL cross each other, but is not limited thereto. The first subpixel P1 may be disposed to overlap the second overlapping area IA2, and the third subpixel P3 may be disposed to overlap the first overlapping area IA1. Also, the first subpixel P1 and the third subpixel P3 may be disposed alternately along the common power line VSSL, or may be disposed alternately along the pixel power line VDDL.

The second subpixel P2 may be disposed between the first overlapping area IA1 and the second overlapping area IA2. For example, the second subpixel P2 may be disposed between the first subpixel P1 and the third subpixel P3. At this time, at least a part of the second subpixel P2 may be overlapped with the gate line GL.

Each of the first subpixel P1, the second subpixel P2 and the third subpixel P3, as shown in FIG. 4, may include a circuit element that includes a capacitor, a thin film transistor, etc., and a light emitting diode. The thin film transistor may include a switching transistor, a sensing transistor, and a driving transistor T.

The switching transistor is switched in accordance with a gate signal supplied to the gate line GL and serves to supply a data voltage supplied from the data line to the driving transistor T.

The sensing transistor serves to sense a threshold voltage deviation of the driving transistor T, which is a cause of image quality degradation.

The driving transistor T is switched in accordance with the data voltage supplied from the switching transistor to generate a data current from a power source supplied from the pixel power line VDDL, and serves to supply the generated data current to the anode electrode 120 of the pixel.

The driving transistor T includes an active layer ACT, a gate electrode GE, a source electrode SE, and a drain electrode DE.

In detail, the active layer ACT may be provided over the first substrate 111. The active layer ACT may be formed of a silicon based semiconductor material or an oxide based semiconductor material. A buffer layer (not shown) may be provided between the active layer ACT and the first substrate 111.

A gate insulating layer GI may be provided over the active layer ACT. The gate insulating layer GI may be formed as an inorganic film, for example, a silicon oxide (SiOx) film, a silicon nitride (SiNx) film, or a multi-layered film of SiOx and SiNx.

A gate electrode GE may be provided over the gate insulating layer GI. The gate electrode GE may be formed of a single layer or a multi-layer made of any one of Mo, Al, Cr, Au, Ti, Ni, Nd and Cu or their alloy.

A first inter-layer insulating layer ILD1 and a second inter-layer insulating layer ILD2 may be provided over the gate electrode GE. The first inter-layer insulating layer ILD1 and the second inter-layer insulating layer ILD2 may be formed as an inorganic layer, for example, a silicon oxide (SiOx) layer, a silicon nitride (SiNx) layer, or a multi-layered layer of SiOx and SiNx.

Source and drain electrodes SE and DE may be provided over the second inter-layer insulating layer ILD2. One of the source and drain electrodes SE and DE may be connected to the active layer ACT through a second contact hole CH2 that passes through the gate insulating layer GI and the first and second inter-layer insulating layers ILD1 and ILD2.

The source and drain electrodes SE and DE may be formed of a single layer or a multi-layer made of any one of Mo, Al, Cr, Au, Ti, Ni, Nd and Cu or their alloy.

A first planarization layer PLN1 may be provided over the source and drain electrodes SE and DE to planarize a step difference caused by the driving transistor T. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a third contact hole CH3 that passes through the first planarization layer PLN1. For example, the anode auxiliary electrode 115 may be connected to the drain electrode DE through the third contact hole CH3 that passes through the first planarization layer PLN1.

The anode auxiliary electrode 115 may be formed of a single layer or a multi-layer made of any one of Mo, Al, Cr, Au, Ti, Ni, Nd and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

Light emitting diodes, which are comprised of the anode electrode 120, an organic light emitting layer 130, and a cathode electrode 140, and a bank 125 are provided over the second planarization layer PLN2.

The anode electrode 120 may be provided over the second planarization layer PLN2, and may be connected with the driving transistor T. In detail, the anode electrode 120 may be connected to the anode auxiliary electrode 115 through a first contact hole CH1 that passes through the second planarization layer PLN2. Since the anode auxiliary electrode 115 is connected to the source electrode SE or the drain electrode DE of the driving transistor T through the third contact hole CH3, the anode electrode 120 may electrically be connected with the driving transistor T.

The anode electrode 120 may be provided for each of the subpixels P1, P2 and P3. In detail, one anode electrode 120 may be formed in the first subpixel P1, another anode electrode 120 may be formed in the second subpixel P2, and other anode electrode 120 may be formed in the third subpixel P3. The anode electrode 120 is not provided in the transmissive area TA.

The anode electrode 120 according to one embodiment of the present disclosure may include a first anode electrode 121, a second anode electrode 122 and a third anode electrode 123.

The first anode electrode 121 may be disposed over the common power line VSSL. In detail, at least a part of the first anode electrode 121 may be disposed to overlap the first overlapping area IA1 where the common power line VSSL and the gate line GL cross each other.

The first anode electrode 121 may be provided over the common power line VSSL in a plural number along the common power line VSSL. The subpixels provided with the plurality of first anode electrodes 121 may be at least one of the first subpixel P1 and the third subpixel P3. For example, the subpixels provided with the plurality of first anode electrodes 121 may be the first subpixels P1. For another example, the subpixels provided with the plurality of first anode electrodes 121 may be the third subpixels P3. For other example, the subpixels provided with the plurality of first anode electrodes 121 may be the first subpixels P1 and the third subpixels P3. At this time, the first subpixels P1 and the third subpixels P3 may alternately be disposed over the common power line VSSL.

The third anode electrode 123 may be disposed over the pixel power line VDDL. In detail, at least a part of the third anode electrode 123 may be disposed to overlap the second overlapping area IA2 where the pixel power line VDDL and the gate line GL cross each other.

The third anode electrode 123 may be provided over the pixel power line VDDL in a plural number along the pixel power line VDDL. The subpixels provided with the plurality of third anode electrodes 123 may be at least one of the first subpixel P1 and the third subpixel P3. For example, the subpixels provided with the plurality of third anode electrodes 123 may be the first subpixels P1. For another example, the subpixels provided with the plurality of third anode electrodes 123 may be the third subpixels P3. For other example, the subpixels provided with the plurality of third anode electrodes 123 may be the first subpixels P1 and the third subpixels P3. At this time, the first subpixels P1 and the third subpixels P3 may alternately be disposed over the pixel power line VDDL.

The second anode electrode 122 may be disposed between the first anode electrode 121 and the third anode electrode 123. In detail, the second anode electrode 122 may be disposed over the gate line GL provided between the first overlapping area IA1 and the second overlapping area IA2.

The first anode electrode 121 and the third anode electrode 123 may have shapes different from a shape of the second anode electrode 122.

In detail, the first anode electrode 121, as shown in FIGS. 6A to 6C, may include a first portion 121a, a second portion 121b and a third portion 121c. At least a part of the first portion 121a of the first anode electrode 121 may be disposed to overlap the first overlapping area IA1 where the common power line VSSL and the gate line GL cross each other. For example, the first portion 121a of the first anode electrode 121, as shown in FIGS. 6A to 6C, may have a rectangular shape but is not limited thereto. The first portion 121a of the first anode electrode 121 may be formed in various shapes such as a circle, a semi-circle, and a polygonal shape.

The first portion 121a of the first anode electrode 121 may be provided with a thin film transistor, such as a switching transistor, a sensing transistor and a driving transistor T, and a capacitor therebelow. The first portion 121a of the first anode electrode 121 may have a width WA1 that may overlay the thin film transistor and the capacitor, which are provided therebelow.

The second portion 121b of the first anode electrode 121 may be protruded from one side S1-1 of the first portion 121a. At this time, the second portion 121b of the first anode electrode 121 may be disposed over the common power line VSSL. That is, one side S1-1 of the first portion 121a may correspond to a side crossing the common power line VSSL. The second portion 121b of the first anode electrode 121 may be protruded toward a direction where the common power line VSSL is extended, that is, a second direction (Y axis direction).

The second portion 121b of the first anode electrode 121 may include a first side S2-1 facing the first portion 121a, and second and third sides S2-2 and S2-3 connecting the first side S2-1 with the first portion 121a.

The second portion 121b of the first anode electrode 121 may have a width WA2 at the first side S2-1, which is narrower than the width WA1 of the first portion 121a of the first anode electrode 121. The second portion 121b of the first anode electrode 121 may be provided with a plurality of metal lines therebelow, for example, a common power line VSSL, data lines DL1 and DL2, and reference lines REFL1 and REFL2. At this time, the common power line VSSL, the data lines DL1 and DL2 and the reference lines REFL1 and REFL2 may be disposed in parallel in the same direction, that is, a second direction (Y axis direction) as shown in FIG. 3. Therefore, the second portion 121b of the first anode electrode 121 may overlay the plurality of metal lines by the width WA2 narrower than the width WA1 of the first portion 121a of the first anode electrode 121.

Meanwhile, the second portion 121b of the first anode electrode 121, as shown in FIG. 6A, may be protruded from one side S1-1 of the first portion 121a and extended with a certain width WA2 but is not limited thereto.

The width of the second portion 121b of the first anode electrode 121 may not be constant. For example, the second portion 121b of the first anode electrode 121, as shown in FIG. 6B, may be provided with a curved portion CV between the first side S2-1 and the first portion 121a. In detail, the second portion 121b of the first anode electrode 121 may include second and third sides S2-2 and S2-3 connecting the first side S2-1 with the first portion 121a. The second side S2-2 of the second portion 121b of the first anode electrode 121 may include a curved portion CV connected from one point to the first portion 121a by a curve. Also, the third side S2-3 of the second portion 121b of the first anode electrode 121 may include a curved portion CV connected from one point to the first portion 121a by a curve. At this time, the curved portion CV may be recessed toward an inward direction.

For another example, the second portion 121b of the first anode electrode 121, as shown in FIG. 6C, may be provided with a diagonal portion DG between the first side S2-1 and the first portion 121a. In some embodiments, this diagonal portion DG may include a substantially linear portion between the first portion 121a of the first anode electrode 121 and the second portion 121b of the first anode electrode 121. Other diagonal portion DG shown in FIG. 6C may include a substantially linear portion as well. In detail, the second portion 121b of the first anode electrode 121 may include second and third sides S2-2 and S2-3 connecting the first side S2-1 with the first portion 121a. The second side S2-2 of the second portion 121b of the first anode electrode 121 may include a diagonal portion DG connected from one point to the first portion 121a by a diagonal line. Also, the third side S2-3 of the second portion 121b of the first anode electrode 121 may include a diagonal portion DG connected from one point to the first portion 121a by a diagonal line.

The third portion 121c of the first anode electrode 121 may be protruded from the other side S1-2 of the first portion 121a. At this time, the third portion 121c of the first anode electrode 121 may be disposed over the common power line VSSL. That is, the other side S1-2 of the first portion 121a may correspond to a side crossing the common power line VSSL. The third portion 121c of the first anode electrode 121 may be protruded toward a direction where the common power line VSSL is extended, that is, a second direction (Y axis direction).

The third portion 121c of the first anode electrode 121 may include a first side S3-1 facing the first portion 121a, and second and third sides S3-2 and S3-3 connecting the first side S3-1 with the first portion 121a.

The third portion 121c of the first anode electrode 121 may have a width WA3 at the first side S3-1, which is narrower than the width WA1 of the first portion 121a of the first anode electrode 121. The third portion 121c of the first anode electrode 121 may be provided with a plurality of metal lines therebelow, for example, a common power line VSSL, data lines DL1 and DL2, and reference lines REFL1 and REFL2. At this time, the common power line VSSL, the data lines DL1 and DL2 and the reference lines REFL1 and REFL2 may be disposed in parallel in the same direction, that is, a second direction (Y axis direction). Therefore, the third portion 121c of the first anode electrode 121 may overlay the plurality of metal lines by the width WA3 narrower than the width WA1 of the first portion 121a of the first anode electrode 121.

In the third portion 121c of the first anode electrode 121, the width WA3 at the first side S3-1 may be equal to the width WA2 of the second portion 121b of the first anode electrode 121. The third portion 121c of the first anode electrode 121 and the second portion 121b of the first anode electrode 121 may have symmetric shapes by interposing the first portion 121a of the first anode electrode 121.

Meanwhile, the third portion 121c of the first anode electrode 121, as shown in FIG. 6A, may be protruded from the other side S1-2 of the first portion 121a and extended with a certain width WA3 but is not limited thereto.

The width of the third portion 121c of the first anode electrode 121 may not be constant. For example, the third portion 121c of the first anode electrode 121, as shown in FIG. 6B, may be provided with a curved portion CV between the first side S2-1 and the first portion 121a. In detail, the third portion 121c of the first anode electrode 121 may include second and third sides S3-2 and S3-3 connecting the first side S3-1 with the first portion 121a. The second side S3-2 of the third portion 121c of the first anode electrode 121 may include a curved portion CV connected from one point to the first portion 121a by a curve. Also, the third side S3-3 of the third portion 121c of the first anode electrode 121 may include a curved portion CV connected from one point to the first portion 121a by a curve. At this time, the curved portion CV may be recessed toward an inward direction.

For another example, the third portion 121c of the first anode electrode 121, as shown in FIG. 6C, may be provided with a diagonal portion DG between the first side S3-1 and the first portion 121a. In detail, the third portion 121b of the first anode electrode 121 may include second and third sides S3-2 and S3-3 connecting the first side S3-1 with the first portion 121a. The second side S3-2 of the third portion 121c of the first anode electrode 121 may include a diagonal portion DG connected from one point to the first portion 121a by a diagonal line. Also, the third side S3-3 of the third portion 121c of the first anode electrode 121 may include a diagonal portion DG connected from one point to the first portion 121a by a diagonal line.

The third anode electrode 123, as shown in FIGS. 6A to 6C, may include a first portion 123a, a second portion 123b and a third portion 123c. At least a part of the first portion 123a of the third anode electrode 123 may be disposed to overlap the second overlapping area IA2 where the pixel power line VDDL and the gate line GL cross each other. For example, the first portion 123a of the third anode electrode 123, as shown in FIGS. 6A to 6C, may have a rectangular shape but is not limited thereto. The first portion 123a of the third anode electrode 123 may be formed in various shapes such as a circle, a semi-circle, and a polygonal shape.

The first portion 123a of the third anode electrode 123 may be provided with a thin film transistor, such as a switching transistor, a sensing transistor and a driving transistor T, and a capacitor therebelow. The first portion 123a of the third anode electrode 123 may have a width WA1 that may overlay the thin film transistor and the capacitor, which are provided therebelow.

The second portion 123b of the third anode electrode 123 may be protruded from one side S1-1 of the first portion 123a. At this time, the second portion 123b of the third anode electrode 123 may be disposed over the pixel power line VDDL. That is, one side S1-1 of the first portion 123a may correspond to a side crossing the pixel power line VDDL. The second portion 123b of the third anode electrode 123 may be protruded toward a direction where the pixel power line VDDL is extended, that is, a second direction (Y axis direction).

The second portion 123b of the third anode electrode 123 may include a first side S2-1 facing the first portion 123a, and second and third sides S2-2 and S2-3 connecting the first side S2-1 with the first portion 123a.

The second portion 123b of the third anode electrode 123 may have a width WA2 at the first side S2-1, which is narrower than the width WA1 of the first portion 123a of the third anode electrode 123. The second portion 123b of the third anode electrode 123 may be provided with a plurality of metal lines therebelow, for example, a pixel power line VDDL, data lines DL1 and DL2, and reference lines REFL1 and REFL2. At this time, the pixel power line VDDL, the data lines DL1 and DL2 and the reference lines REFL1 and REFL2 may be disposed in parallel in the same direction, that is, a second direction (Y axis direction) as shown in FIG. 3. Therefore, the second portion 123b of the third anode electrode 123 may overlay the plurality of metal lines by the width WA2 narrower than the width WA1 of the first portion 123a of the third anode electrode 123.

Meanwhile, the second portion 123b of the third anode electrode 123, as shown in FIG. 6A, may be protruded from one side S1-1 of the first portion 123a and extended with a certain width WA2 but is not limited thereto.

The width of the second portion 123b of the third anode electrode 123 may not be constant. For example, the second portion 123b of the third anode electrode 123, as shown in FIG. 6B, may be provided with a curved portion CV between the first side S2-1 and the first portion 123a. In detail, the second portion 123b of the third anode electrode 123 may include second and third sides S2-2 and S2-3 connecting the first side S2-1 with the first portion 123a. The second side S2-2 of the second portion 123b of the third anode electrode 123 may include a curved portion CV connected from one point to the first portion 123a by a curve. Also, the third side S2-3 of the second portion 123b of the third anode electrode 123 may include a curved portion CV connected from one point to the first portion 123a by a curve. At this time, the curved portion CV may be recessed toward an inward direction.

For another example, the second portion 123b of the third anode electrode 123, as shown in FIG. 6C, may be provided with a diagonal portion DG between the first side S2-1 and the first portion 123a. In detail, the second portion 123b of the third anode electrode 123 may include second and third sides S2-2 and S2-3 connecting the first side S2-1 with the first portion 123a. The second side S2-2 of the second portion 123b of the third anode electrode 123 may include a diagonal portion DG connected from one point to the first portion 123a by a diagonal line. Also, the third side S2-3 of the second portion 123b of the third anode electrode 123 may include a diagonal portion DG connected from one point to the first portion 123a by a diagonal line.

The third portion 123c of the third anode electrode 123 may be protruded from the other side S1-2 of the first portion 123a. At this time, the third portion 123c of the third anode electrode 123 may be disposed over the pixel power line VDDL. That is, the other side S1-2 of the first portion 123a may correspond to a side crossing the pixel power line VDDL. The third portion 123c of the third anode electrode 123 may be protruded toward a direction where the pixel power line VDDL is extended, that is, a second direction (Y axis direction).

The third portion 123c of the third anode electrode 123 may include a first side S3-1 facing the first portion 123a, and second and third sides S3-2 and S3-3 connecting the first side S3-1 with the first portion 123a.

The third portion 123c of the third anode electrode 123 may have a width WA3 at the first side S3-1, which is narrower than the width WA1 of the first portion 123a of the third anode electrode 123. The third portion 123c of the third anode electrode 123 may be provided with a plurality of metal lines therebelow, for example, a pixel power line VDDL, data lines DL1 and DL2, and reference lines REFL1 and REFL2. At this time, the pixel power line VDDL, the data lines DL1 and DL2 and the reference lines REFL1 and REFL2 may be disposed in parallel in the same direction, that is, a second direction (Y axis direction). Therefore, the third portion 123c of the third anode electrode 123 may overlay the plurality of metal lines by the width WA3 narrower than the width WA1 of the first portion 123a of the third anode electrode 123.

In the third portion 123c of the third anode electrode 123, the width WA3 at the first side S3-1 may be equal to the width WA2 of the second portion 123b of the third anode electrode 123. The third portion 123c of the third anode electrode 123 and the second portion 123b of the third anode electrode 123 may have symmetric shapes by interposing the first portion 123a of the third anode electrode 123.

Meanwhile, the third portion 123c of the third anode electrode 123, as shown in FIG. 6A, may be protruded from the other side S1-2 of the first portion 123a and extended with a certain width WA3 but is not limited thereto.

The width of the third portion 123c of the third anode electrode 123 may not be constant. For example, the third portion 123c of the third anode electrode 123, as shown in FIG. 6B, may be provided with a curved portion CV between the first side S3-1 and the first portion 123a. In detail, the third portion 123c of the third anode electrode 123 may include second and third sides S3-2 and S3-3 connecting the first side S3-1 with the first portion 123a. The second side S3-2 of the third portion 123c of the third anode electrode 123 may include a curved portion CV connected from one point to the first portion 123a by a curve. Also, the third side S3-3 of the third portion 123c of the third anode electrode 123 may include a curved portion CV connected from one point to the first portion 123a by a curve. At this time, the curved portion CV may be recessed toward an inward direction.

For another example, the third portion 123c of the third anode electrode 123, as shown in FIG. 6C, may be provided with a diagonal portion DG between the first side S3-1 and the first portion 123a. In detail, the third portion 123c of the third anode electrode 123 may include second and third sides S3-2 and S3-3 connecting the first side S3-1 with the first portion 123a. The second side S3-2 of the third portion 123c of the third anode electrode 123 may include a diagonal portion DG connected from one point to the first portion 123a by a diagonal line. Also, the third side S3-3 of the third portion 123c of the third anode electrode 123 may include a diagonal portion DG connected from one point to the first portion 123a by a diagonal line.

In the transparent display panel 110 according to one embodiment of the present disclosure, the first anode electrode 121 and the third anode electrode 123 may include first portions 121a and 123a, and second portions 121b and 123b and third portions 121c and 123c protruded from the first portions 121a and 123a in the second direction (Y axis direction).

At this time, the second portions 121b and 123b and the third portions 121c and 123c may overlay the plurality of metal lines provided therebelow and extended in the second direction (Y axis direction). At this time, the plurality of metal lines may include a common power line VSSL or the pixel power line VDDL, data lines DL1 and DL2, and reference lines REFL1 and REFL2. The data lines DL1 and DL2 and the reference lines REFL1 and REFL2, as shown in FIG. 5, may be disposed to be spaced apart from each other on the same layer. In detail, the data lines DL1 and DL2 and the reference lines REFL1 and REFL2 may be disposed to be spaced apart from the source electrode SE and the drain electrode DE of the driving transistor T on the same layer as the source electrode SE and the drain electrode DE. The common power line VSSL or the pixel power line VDDL may be disposed on the same layer as the anode auxiliary electrode 115.

If these metal lines are disposed in parallel to be spaced apart from one another, a slit, specifically a linear or rectangular shape may be formed between the metal lines. If external light passes through the slit, diffraction may occur.

Diffraction may mean that interference occurs in spherical waves after plane waves are changed to the spherical waves as light passes through the slit. Therefore, as constructive interference and destructive interference occur in the spherical waves, the external light that has passed through the slit may have irregular light intensity. As a result, definition of an object or image arranged at an opposite side of the transparent display panel 110 may be reduced.

In the transparent display panel 110 according to one embodiment of the present disclosure, the second portions 121b and 123b and the third portions 121c and 123c protruded from the first portions 121a and 123a in the second direction (Y axis direction) may be formed in the first anode electrode 121 and the third anode electrode 123 to overlay the plurality of metal lines provided below the first anode electrode 121 and the third anode electrode 123 if possible. Therefore, the transparent display panel 110 according to one embodiment of the present disclosure may prevent diffraction from occurring due to the plurality of metal lines.

Moreover, the transparent display panel 110 according to one embodiment of the present disclosure may increase an area of an emission area EA by forming the second portions 121b and 123b and the third portions 121c and 123c in the first anode electrode 121 and the third anode electrode 123.

Also, in the transparent display panel 110 according to one embodiment of the present disclosure, the second portions 121b and 123b and the third portions 121c and 123c may have minimum widths WA2 and WA3 that may overlay the plurality of metal lines. Therefore, the transparent display panel 110 according to one embodiment of the present disclosure may improve transmittance by making sure of a maximum area of the transmissive area TA.

Meanwhile, in some embodiments, the second anode electrode 122, as shown in FIG. 6D, may be provided with only the first portion 122a. The first portion 122a of the second anode electrode 122, as shown in FIG. 6D, may have a rectangular shape but is not limited thereto. The first portion 122a of the second anode electrode 122 may be formed in various shapes such as a circle, a semi-circle, and a polygonal shape.

The first portion 122a of the second anode electrode 122 may be provided with a thin film transistor, such as a switching transistor, a sensing transistor and a driving transistor T, and a capacitor therebelow. The first portion 122a of the second anode electrode 122 may have a width WA4 that may overlay the thin film transistor and the capacitor, which are provided therebelow. The width WA4 of the first portion 122a of the second anode electrode 122 may be narrower than the width WA1 of the first portions 121a and 123a of the first and third anode electrodes 121 and 123 but is not limited thereto. The width WA4 of the first portion 122a of the second anode electrode 122 may be equal to the width WA1 of the first portions 121a and 123a of the first and third anode electrodes 121 and 123.

Meanwhile, the second anode electrode 122 is not provided with a portion protruded from the first portion 122a unlike the first anode electrode 121 and the third anode electrode 123. At least a part of the second anode electrode 122 is overlapped with the gate line GL extended in the first direction (X axis direction), and is not overlapped with the common power line VSSL or the pixel power line VDDL extended in the second direction (Y axis direction). Therefore, if the second anode electrode 122 forms the portion protruded from the first portion 122a in the second direction (Y axis direction), the non-transmissive area NTA may be increased unnecessarily, and the area of the transmissive area TA may be reduced. Therefore, in some embodiments, it may be beneficial for the second anode electrode 122 to be provided with only the first portion 122a.

Consequently, the second anode electrode 122 may have an area smaller than those of the first anode electrode 121 and the third anode electrode 123. Therefore, the second subpixel P2 provided with the second anode electrode 122 may have a light emission area smaller than those of the first subpixel P1 and the third subpixel P3 provided with the first anode electrode 121 or the third anode electrode 123. The second subpixel P2 may be a red subpixel emitting red light. Generally, since the red subpixel has lifetime more excellent than a green subpixel and a blue subpixel, even though the red subpixel is formed with a small area, lifetime of the transparent display panel 110 may not be reduced.

The first anode electrode 121, the second anode electrode 122 and the third anode electrode 123 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over a second planarization layer PLN2. Also, the bank 125 may be provided among the anode electrodes 120. In detail, the bank 125 may be provided among the first anode electrode 121, the second anode electrode 122 and the third anode electrode 123, which are disposed to adjoin one another in the first direction (X axis direction). Also, the bank 125 may be provided among a plurality of first anode electrodes 121 disposed over the common power line VSSL along the second direction (Y axis direction). Also, the bank 125 may be provided among a plurality of third anode electrodes 123 disposed over the pixel power line VDDL along the second direction (Y axis direction).

The bank 125 may be formed to at least partially cover each edge of the first anode electrode 121, the second anode electrode 122 and the third anode electrode 123 and partially expose each of the first anode electrode 121, the second anode electrode 122 and the third anode electrode 123. Therefore, the bank 125 may prevent light emitting efficiency from being deteriorated due to a current concentrated on the ends of the first anode electrode 121, the second anode electrode 122 and the third anode electrode 123. The bank 125, in some embodiments, may be provided in only the non-transmissive area NTA, and may not be provided in the transmissive area TA.

In some embodiments, the bank 125 may respectively define emission areas EA1, EA2, and EA3 of the subpixels P1, P2 and P3. Each of the emission areas EA1, EA2 and EA3 of the subpixels P1, P2 and P3 indicates an area where the anode electrode 120, the organic light emitting layer 130 and the cathode electrode 140 are sequentially deposited and then holes from the anode electrode 120 and electrons from the cathode electrode 140 are combined with each other in the organic light emitting layer 130 to emit light. In this case, the area where the bank 125 is not formed and the anode electrode 120 is exposed may be an emission area EA, and the other area may be a non-emission area NEA.

The bank 125 may be formed of an organic layer, for example, acryl resin, epoxy resin, phenolic resin, polyamide resin, polyimide resin, etc.

The spacer 127 may be provided over the bank 125. In detail, the spacer 127 may be provided over the bank 125 disposed between the plurality of first anode electrodes 121. At this time, at least a part of the spacer 127, as shown in FIG. 3, may be overlapped with ends of the first anode electrodes 121 disposed to adjoin each other.

Also, the spacer 127 may be on the bank 125 disposed between the plurality of third anode electrodes 123. At this time, at least a part of the spacer 127, as shown in FIG. 3, may be overlapped with ends of the third anode electrodes 123 disposed to adjoin each other.

The spacer 127 may not be on the bank 125 disposed among the first anode electrode 121, the second anode electrode 122 and the third anode electrode 123. The spaced distances among the first anode electrode 121, the second anode electrode 122 and the third anode electrode 123 may be formed to be short. If the spacer 127 is formed among the first anode electrode 121, the second anode electrode 122 and the third anode electrode 123, the spaced distances among the first anode electrode 121, the second anode electrode 122 and the third anode electrode 123 may be increased. For this reason, the area of the emission area EA in the non-transmissive area NTA may be reduced.

On the other hand, the spaced distance between the first anode electrodes 121 disposed over the common power line VSSL along the second direction (Y axis direction) may be relatively long. Therefore, even though the spacer 127 is formed between the first anode electrodes 121, the spaced distance between the first anode electrodes 121 may not be increased. Therefore, the spacer 127 may be formed without decrease of the area of the emission area EA in the non-transmissive area NTA.

Also, the spaced distance between the third anode electrodes 123 disposed over the pixel power line VDDL along the second direction (Y axis direction) may be relatively long. Therefore, even though the spacer 127 is formed between the third anode electrodes 123, the spaced distance between the third anode electrodes 123 may not be increased. Therefore, the spacer 127 may be formed without decrease of the area of the emission area EA in the non-transmissive area NTA.

The spacer 127 may be disposed between the transmissive areas TA disposed to adjoin each other in the first direction (X axis direction). The spacer 127 may be formed with a width WS narrower than a width WNTA of the non-transmissive area NTA. Therefore, since the spacer 127 is not overlapped with the transmissive area TA, the spacer 127 may not affect transmittance of the transmissive area TA.

In the transparent display panel 110 according to one embodiment of the present disclosure, the spacer 127 may be formed without decrease of the area of the emission area EA. Also, in the transparent display panel 110 according to one embodiment of the present disclosure, the mask may be disposed over the spacer 127 in the process of forming the light emitting layer, whereby the light emitting layer may be formed to be accurately patterned. Also, in the transparent display panel 110 according to one embodiment of the present disclosure, the elements formed over the first substrate 111 may be prevented from being damaged by the mask.

Meanwhile, although FIG. 3 shows that the spacer 127 is provided to correspond to each of all the first subpixels P1 and all the third subpixels P3, the present disclosure is not limited to the example of FIG. 3. An arrangement density of the spacer 127 may be changed in various ways.

In detail, the first subpixel P1 and the third subpixel P3, as shown in FIGS. 7A to 7C, may be disposed alternately. For example, the spacer 127, as shown in FIG. 7A, may be provided to correspond to each of all the first subpixels P1 and all the third subpixels P3. That is, the spacer 127 may be provided as much as a sum of the number of the first subpixels P1 and the number of the third subpixels P3. For example, for n number of first subpixels P1 and n number of third subpixels P3, there may be 2n number of spacers 127.

For another example, the spacer 127, as shown in FIG. 7B, may be provided to correspond to two of the first subpixels P1 and two of the third subpixels P3. That is, the spacer 127 may be provided as much as a value obtained by dividing the sum of the number of the first subpixels P1 and the number of the third subpixels P3 by 4. For example, for n number of first subpixels P1 and for n number of third subpixels P3, there may be (2n/4) number of spacers 127 (i.e., n/2). The spacer 127 shown in FIG. 7B has an arrangement density smaller than that of the spacer 127 shown in FIG. 7A.

For other example, the spacer 127, as shown in FIG. 7C, may be provided to correspond to four of the first subpixels P1 and five of the third subpixels P3, or five of the first subpixels P1 and four of the third subpixels P3. That is, the spacer 127 may be provided as much as a value obtained by dividing the sum of the number of the first subpixels P1 and the number of the third subpixels P3 by 9. The spacer 127 shown in FIG. 7C has an arrangement density smaller than that of the spacer 127 shown in FIG. 7B. However, the arrangement pattern or density of the spacers 127 is not limited to those shown in FIGS. 7A to 7C, and may be variously changed as needed.

The spacer 127 may be formed of an organic film, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 4, may include light emitting layers each of which is formed for each of the subpixels P1, P2 and P3. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. The cathode electrode 140 may be provided in only the non-transmissive area NTA that includes the emission area EA, and may not be provided in the transmissive area TA to improve transmittance.

The cathode electrode 140 may be a common layer commonly formed for the subpixels P1, P2 and P3 to apply the same voltage to the subpixels P1, P2 and P3. The cathode electrode 140 may be formed of a transparent conductive material (TCO) such as ITO and IZO, which can transmit light, or may be formed of a semi-transmissive conductive material such as Mg, Ag, or alloy of Mg and Ag. If the cathode electrode 140 is formed of a semi-transmissive conductive material, emission efficiency may be enhanced by micro cavity.

The cathode electrode 140 may be formed of ITO or IZO. However, if ITO or IZO has high surface resistance, voltage drop (IR drop) may occur in the cathode electrode 140. In order to prevent voltage drop from occurring, a separate cathode auxiliary electrode may be formed on the same layer as the anode electrode 120, and a cathode contact structure for connecting the cathode electrode 140 to the cathode auxiliary electrode may be formed. However, the cathode contact structure may increase the area of the non-transmissive area NTA because the cathode auxiliary electrode should be formed between the anode electrodes 120. Also, since the spaced distance between the anode electrodes 120 is increased, the area of the emission area EA in the non-transmissive area NTA may be reduced.

In the transparent display panel 110 according to one embodiment of the present disclosure, the cathode electrode 140 may be formed of a low resistance metal material, for example, Ag or an alloy of Mg and Ag. Since Ag or the alloy of Mg and Ag has low resistance, voltage drop (IR drop) may not occur. In the transparent display panel 110 according to one embodiment of the present disclosure, since the cathode auxiliary electrode and the cathode contact structure are not formed in the display area DA, the area of the transmissive area TA may be maximized, and the area of the emission area EA in the non-transmissive area NTA may also be increased or maximized.

Also, since Ag or the alloy of Mg and Ag of a thin thickness has high light transmittance, even though the cathode electrode 140 is formed in the transmissive area TA, transmittance of the transmissive area may not be reduced.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic film and at least one organic film.

Meanwhile, although not shown in FIG. 4, a capping layer may additionally be formed between the cathode electrode 140 and the encapsulation layer 150.

A color filter layer 170 may be provided over the encapsulation layer 150. The color filter layer 170 may be provided over one surface of the second substrate 112 that faces the first substrate 111. In this case, the first substrate 111 provided with the encapsulation layer 150 and the second substrate 112 provided with the color filter layer 170 may be bonded to each other by an adhesive layer 160. At this time, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

The transparent display panel 110 according to one embodiment of the present disclosure is characterized in that a polarizer is not used, and the color filter layer 170 is formed in the second substrate 112. If the polarizer is attached to the transparent display panel 110, transmittance of the transparent display panel 110 is reduced by the polarizer. Meanwhile, if the polarizer is not attached to the transparent display panel 110, a problem occurs in that externally incident light is reflected towards the electrodes.

Since a polarizer is not attached to the transparent display panel 110 according to one embodiment of the present disclosure, transmittance may be prevented from being reduced. Also, in the transparent display panel 110 according to one embodiment of the present disclosure, the color filter layer 170 may be formed in the second substrate 112 to partially absorb externally incident light, thereby preventing the incident light from being reflected toward the electrodes. That is, the transparent display panel 110 according to one embodiment of the present disclosure may reduce external light reflectivity without reducing transmittance.

Meanwhile, a black matrix BM may be provided among the color filters CF1, CF2 and CF3. The black matrix BM may be provided among the subpixels P1, P2 and P3 to prevent color mixture among the adjacent subpixels P1, P2 and P3 from occurring. Also, the black matrix BM may prevent externally incident light from being reflected toward a plurality of lines provided among the subpixels P1, P2 and P3, for example, the gate lines, the data lines, the pixel power lines, the common power lines, the reference lines, etc.

The black matrix BM may include a material that absorbs light, for example, a black dye that absorbs light of a visible light wavelength range.

Referring to FIG. 2 again, the non-display area NDA may be provided with a pad area PA in which pads PAD are disposed, and at least one gate driver 205.

In detail, the non-display area NDA may include a first non-display area NDA1 in which the pads PAD are disposed, a second non-display area NDA2 disposed in parallel with the first non-display area NDA1 by interposing the display area DA, and third and fourth non-display areas NDA3 and NDA4 connecting the first non-display area NDA1 with the second non-display area NDA2.

The gate driver 205 is connected to the gate lines GL and supplies gate signals to the gate lines GL. The gate driver 205 may be disposed in at least one of the fourth non-display area NDA4 and the third non-display area NDA3 in a gate drive in panel (GIP) type. For example, as shown in FIG. 2, the gate driver 205 may be formed in the fourth non-display area NDA4, and another gate driver 205 may be formed in the third non-display area NDA3, but is not limited thereto. The gate driver 205 may be formed in any one of the fourth non-display area NDA4 and the third non-display area NDA3.

The pads PAD may include a first pad VDDP, a second pad VSSP, a third pad VREFP, and a fourth pad DP, and may be provided in the first non-display area NDA1. That is, the first non-display area NDA1 may include a pad area PA.

In the transparent display panel 110 according to one embodiment of the present disclosure, a plurality of circuits and a plurality of metal lines may be disposed in the non-display area NDA, particularly the first non-display area NDA1 and the second non-display area NDA2. The plurality of circuits may include electrostatic prevention circuits and multiplex circuits disposed in the first non-display area NDA1.

For example, the electrostatic prevention circuits may be circuits for preventing static electricity from entering the transparent display panel 110 or occurring in the transparent display panel 110. The electrostatic prevention circuits may be provided in the first non-display area NDA1. In detail, the electrostatic prevention circuits, as shown in FIG. 8, may be disposed in an area ESDA between the reference line VREF1 and the common power line VSS1 provided in the first non-display area NDA1.

For example, each of the multiplex circuits may be a circuit for driving the plurality of data lines time-divisionally. The multiplex circuits may be disposed over the first non-display area NDA1. In detail, the multiplex circuits may be disposed in an area MUXA between the display area DA and the common power line VSS1 provided in the first non-display area NDA1.

The transparent display panel 110 according to one embodiment of the present disclosure may include a plurality of signal lines connected with the subpixels P1, P2 and P3 provided in the display area DA. For example, the transparent display panel 110 according to one embodiment of the present disclosure may include a pixel power line VDD, a common power line VSS and a reference line VREF.

The pixel power line VDD may supply a first power source to the driving transistor T of each of the subpixels P1, P2 and P3 provided in the display area DA.

Accordingly, in some embodiments, the pixel power line VDD may include a first pixel power line VDD1 provided in a first non-display area NDA1, a second pixel power line VDD2 provided in a second non-display area NDA2, and a plurality of third pixel power lines VDDL connecting the first pixel power line VDD1 with the second pixel power line VDD2.

The common power line VSS may supply a second power source to the cathode electrode 140 of the subpixels P1, P2 and P3 provided in the display area DA. At this time, the second power source may be a common power source commonly supplied to the subpixels P1, P2 and P3.

Accordingly, in some embodiments, the common power line VSS may include a first common power line VSS1 provided in the first non-display area NDA1, a second common power line VSS2 provided in the second non-display area NDA2, and a plurality of third common power lines VSSL connecting the first common power line VSS1 with the second common power line VSS2.

The reference line VREF may supply an initialization voltage (or sensing voltage) to the driving transistor T of each of the subpixels P1, P2 and P3 provided in the display area DA.

Accordingly, in some embodiments, the reference line VREF may include a first reference line VREF1 provided in the first non-display area NDA1, and a plurality of second reference lines VREFL disposed in the display area DA.

Hereinafter, the first pixel power line VDD1, the first common power line VSS1 and the first reference line VREF1, which are provided in a first non-display area NDA1, will be described in more detail with reference to FIGS. 8 to 11.

Figure 9:
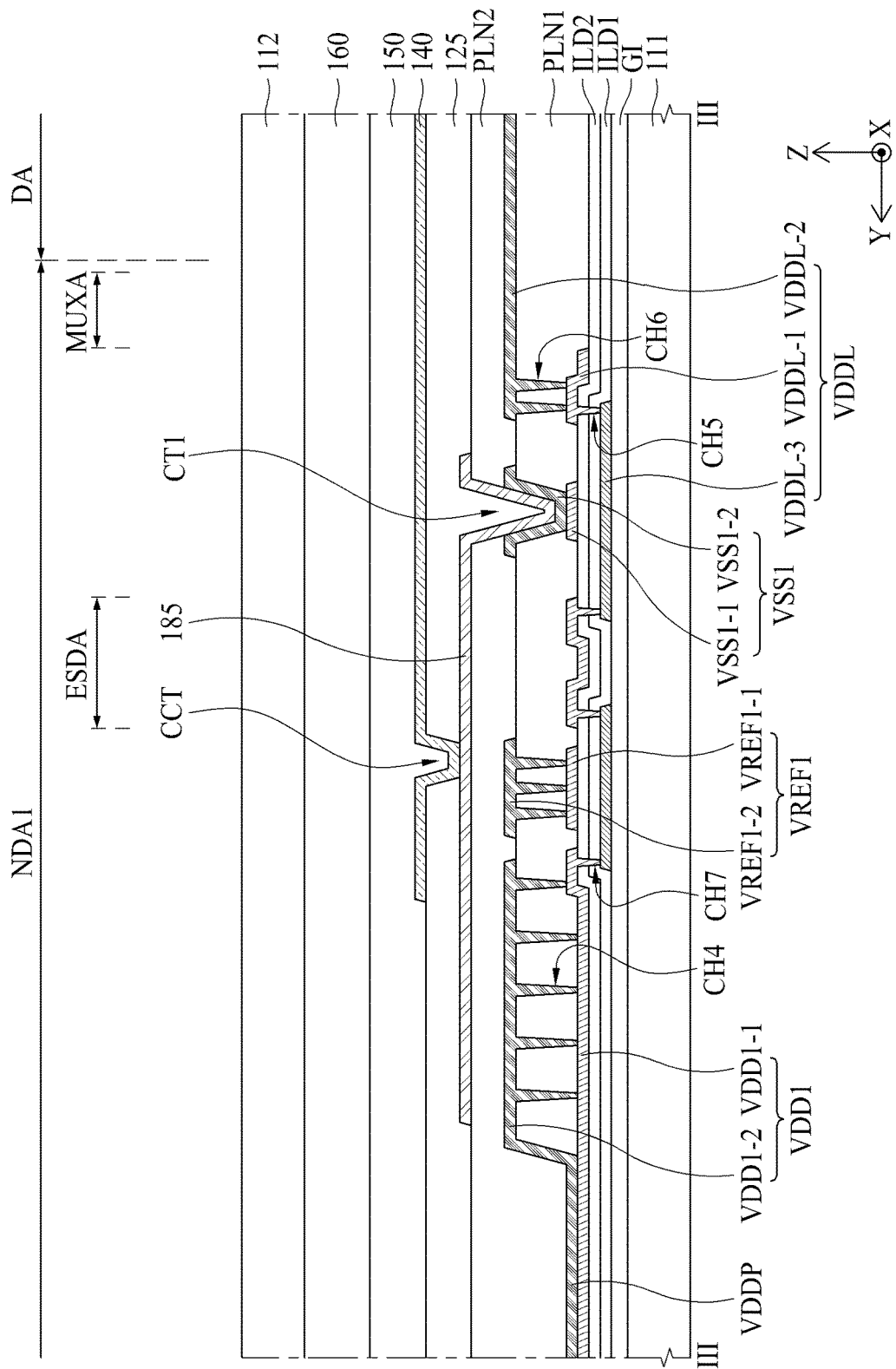
FIG. 9 is a cross-sectional view taken along line III-III' of FIG. 8.
Figure 10:
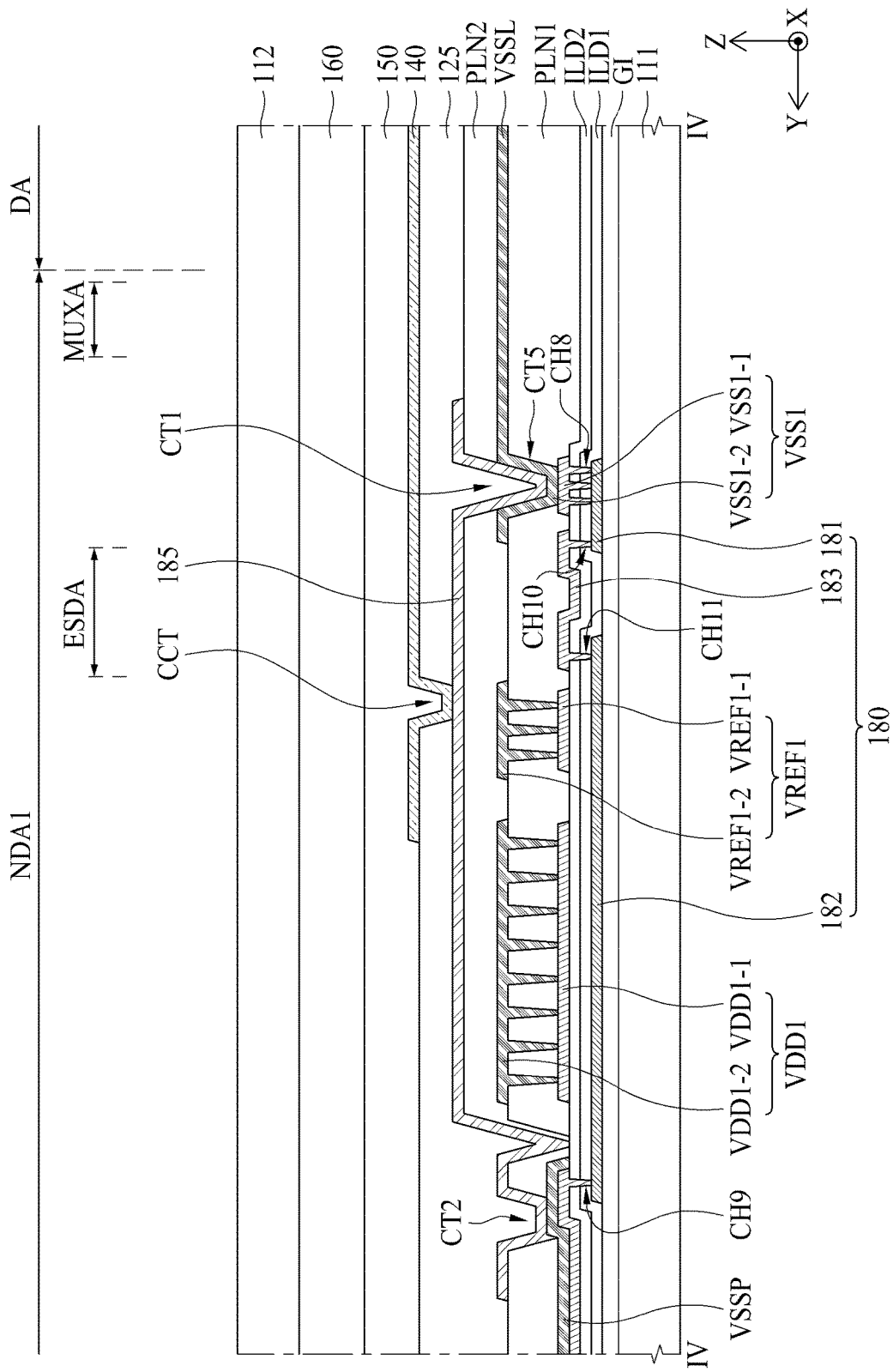
FIG. 10 is a cross-sectional view taken along line IV-IV' of FIG. 8.
Figure 11:
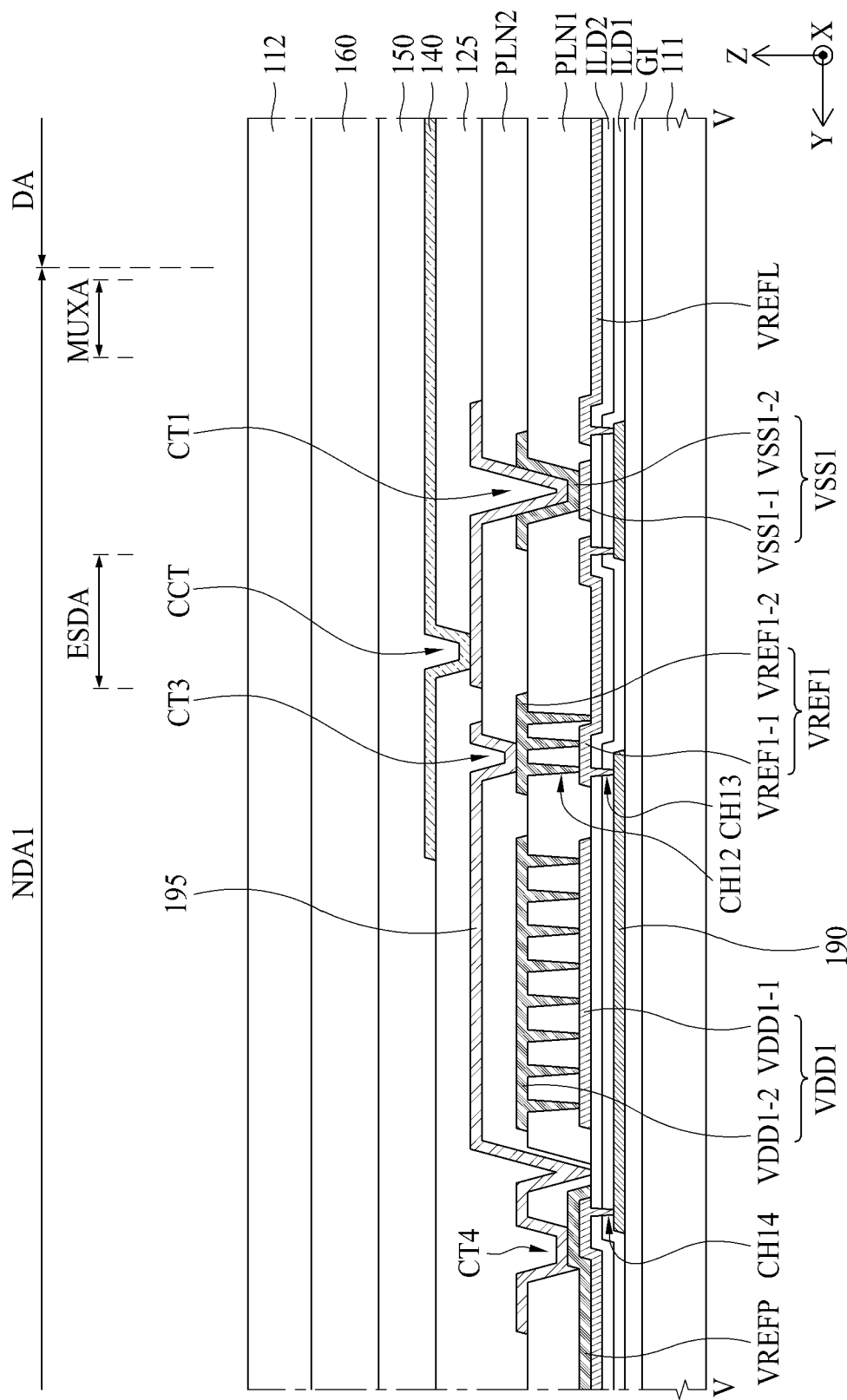
FIG. 11 is a cross-sectional view taken along line V-V' of FIG. 8.

FIG. 8 is an enlarged view of an area B in FIG. 2, FIG. 9 is a cross-sectional view taken along line III-III' of FIG. 8, FIG. 10 is a cross-sectional view taken along line IV-IV' of FIG. 8, and FIG. 11 is a cross-sectional view taken along line V-V' of FIG. 8.

The pads PAD, a first pixel power line VDD1, a first common power line VSS1, a first reference line VREF1, a third pixel power line VDDL and a third common power line VSSL are provided in the first non-display area NDA1.

Referring to FIGS. 2, 8 and 9, the first pixel power line VDD1 may be provided to be extended in the first non-display area NDA1, specifically between the pad area PA and the display area DA in a first direction (X axis direction). The first pixel power line VDD1 may be connected with the first pad VDDP in the first non-display area NDA1, and may be supplied with a first power source from the first pad VDDP. The first pad VDDP may be extended in a second direction (Y axis direction), and may be connected with the first pixel power line VDD1. For example, the first pixel power line VDD1 and the first pad VDDP may be provided in the same layer as shown in FIG. 9, and may be connected with each other without being spaced apart from each other.

Also, the first pixel power line VDD1 may be connected with a plurality of third pixel power lines VDDL disposed in the display area DA, and may supply the first power source to the driving transistor T of each of the subpixels P1, P2 and P3 through the plurality of third pixel power lines VDDL.

The first pixel power line VDD1 may be made of a plurality of metal layers. For example, the first pixel power line VDD1, as shown in FIG. 9, may include a first metal layer VDD1-1 and a second metal layer VDD1-2 provided over the first metal layer VDD1-1. The first metal layer VDD1-1 and the second metal layer VDD1-2 may partially be overlapped with each other, and may be connected with each other through a fourth contact hole CH4.

At this time, the first metal layer VDD1-1 of the first pixel power line VDD1 may be provided in the same layer as the source electrode SE and the drain electrode DE of the driving transistor T provided in the display area DA. The first metal layer VDD1-1 may be made of the same material as that of the source electrode SE and the drain electrode DE of the driving transistor T and may be formed simultaneously with them.

The second metal layer VDD1-2 of the first pixel power line VDD1 may be provided in the same layer as the anode auxiliary electrode 115 provided in the display area DA. The second metal layer VDD1-2 may be made of the same material as that of the anode auxiliary electrode 115 and may be formed simultaneously with the anode auxiliary electrode 115. In this case, the second metal layer VDD1-2 of the first pixel power line VDD1 may be connected to the first metal layer VDD1-1 through a plurality of fourth contact holes CH4 that pass through the first planarization layer PLN1.

In the transparent display panel 110 according to one embodiment of the present disclosure, as the first pixel power line VDD1 provided in the non-display area NDA is provided as a double layer, a total area of the first pixel power line VDD1 may be increased, whereby resistance of the first pixel power line VDD1 may be reduced.

Also, in the transparent display panel 110 according to one embodiment of the present disclosure, as the second metal layer VDD1-2 of the first pixel power line VDD1 may be connected to the first metal layer VDD1-1 through the plurality of fourth contact holes CH4, the first metal layer VDD1-1 and the second metal layer VDD1-2 may stably be connected with each other.

Meanwhile, in the transparent display panel 110 according to one embodiment of the present disclosure, the first metal layer VDD1-1 and the second metal layer VDD1-2 of the first pixel power line VDD1 are not in entire contact with each other. If the first metal layer VDD1-1 and the second metal layer VDD1-2 of the first pixel power line VDD1 are in entire contact with each other, even though the second planarization layer PLN2 is deposited over the second metal layer VDD1-2, an upper surface of the area where the first metal layer VDD1-1 and the second metal layer VDD1-2 are in contact with each other may be formed to be recessed toward the first substrate 111 without being planarized. For this reason, a problem may occur in that the layers formed over the first metal layer VDD1-1 and the second metal layer VDD1-2 of the first pixel power line VDD1, for example, a second common power connection electrode 185, the cathode electrode 140, the encapsulation layer 150 are not deposited stably.

In the transparent display panel 110 according to one embodiment of the present disclosure, the first metal layer VDD1-1 and the second metal layer VDD1-2 of the first pixel power line VDD1 may be in contact with each other through the plurality of fourth contact holes CH4 without entire contact. In the transparent display panel 110 according to one embodiment of the present disclosure, if the second planarization layer PLN2 is formed over the second metal layer VDD1-2, a planarized upper surface may be provided even in the area where the first metal layer VDD1-1 and the second metal layer VDD1-2 are in contact with each other. Therefore, in the transparent display panel 110 according to one embodiment of the present disclosure, the layers formed over the first metal layer VDD1-1 and the second metal layer VDD1-2 of the first pixel power line VDD1, for example, the second common power connection electrode 185, the cathode electrode 140, the encapsulation layer 150 may be deposited stably.

The second pixel power line VDD2 may be provided to be extended in the second non-display area NDA2 in a first direction (X axis direction). The second pixel power line VDD2 may electrically be connected with the first pixel power line VDD1 through the third pixel power line VDDL.

The second pixel power line VDD2 may be made of a plurality of metal layers like the first pixel power line VDD1. For example, the second pixel power line VDD2 may include a first metal layer and a second metal layer provided over the first metal layer like the first pixel power line VDD1.

The third pixel power line VDDL may be provided between the transmissive areas TA in the display area DA, and thus may be connected with the driving transistor T of each of the subpixels P1, P2 and P3. The third pixel power line VDDL may be extended in the display area DA in a second direction (Y axis direction), and thus its one end may be connected with the first pixel power line VDD1.

At this time, the third pixel power line VDDL may be connected with the first pixel power line VDD1 as one layer but may be connected with the first pixel power line VDD1 as a plurality of layers as shown in FIG. 9.

For example, the third pixel power line VDDL may include a second metal layer VDDL-2 and a third metal layer VDDL-3 provided below the second metal layer VDDL-2. The second metal layer VDDL-2 of the third pixel power line VDDL may be extended in the display area DA to the first non-display area NDA1 in a second direction (Y axis direction). The second metal layer VDDL-2 may be provided in the same layer as the anode auxiliary electrode 115 provided in the display area DA. The second metal layer VDDL-2 may be made of the same material as that of the anode auxiliary electrode 115 and may be formed simultaneously with the anode auxiliary electrode 115.

One end of the third metal layer VDDL-3 of the third pixel power line VDDL may be connected to the second metal layer VDDL-2 of the third pixel power line VDDL in the first non-display area NDA1, and the other end thereof may be connected to the first pixel power line VDD1. The third metal layer VDDL-3 may be provided in the same layer as the gate electrode GE of the driving transistor T provided in the display area DA. The third metal layer VDDL-3 may be made of the same material as that of the gate electrode GE of the driving transistor T and may be formed simultaneously with the gate electrode GE.

The third metal layer VDDL-3 of the third pixel power line VDDL may be connected to the second metal layer VDDL-2 of the third pixel power line VDDL at one end through the first metal layer VDDL-1. In this case, the third metal layer VDDL-3 of the third pixel power line VDDL may be connected to the first metal layer VDDL-1 through a fifth contact hole CH5 that passes through the first and second inter-layer insulating layers ILD1 and ILD2. The first metal layer VDDL-1 may be connected to the second metal layer VDDL-2 of the third pixel power line VDDL through a sixth contact hole CH6 that passes through the first planarization layer PLN1. Therefore, the third metal layer VDDL-3 of the third pixel power line VDDL may electrically be connected with the second metal layer VDDL-2 of the third pixel power line VDDL.

Also, the third metal layer VDDL-3 of the third pixel power line VDDL may be connected to the first metal layer VDD1-1 of the first pixel power line VDD1 at the other end through a seventh contact hole CH7 that passes through the first and second inter-layer insulating layers ILD1 and ILD2.

Meanwhile, the third metal layer VDDL-3 of the third pixel power line VDDL may be formed as one line pattern but is not limited thereto. The third metal layer VDDL-3 of the third pixel power line VDDL may include a plurality of line patterns. In this case, the third metal layer VDDL-3 of the third pixel power line VDDL may electrically be connected with the plurality of line patterns through the metal layer provided over another layer, for example, the first metal layer VDDL-1.

Referring to FIGS. 2, 8 and 10, the first common power line VSS1 may be provided to be extended in the first non-display area NDA1, specifically between the first pixel power line VDD1 and the display area DA in a first direction (X axis direction). The first common power line VSS1 may be connected with the second pad VSSP in the first non-display area NDA1, and may be supplied with a second power source from the second pad VSSP. Also, the first common power line VSS1 may be connected with the plurality of third common power lines VSSL disposed in the display area DA, and may supply the second power source to the cathode electrode 140 of the subpixels P1, P2 and P3 through the plurality of third common power lines VSSL.

The first common power line VSS1 may be made of a plurality of metal layers. For example, the first common power line VSS1, as shown in FIG. 10, may include a first metal layer VSS1-1 and a second metal layer VSS1-2 provided over the first metal layer VSS1-1. The first metal layer VSS1-1 and the second metal layer VSS1-2 may partially be overlapped with each other, and may be connected with each other through a fifth contact part CT5.

At this time, the first metal layer VSS1-1 of the first common power line VSS1 may be provided in the same layer as the source electrode SE and the drain electrode DE of the driving transistor T provided in the display area DA. The first metal layer VSS1-1 may be made of the same material as that of the source electrode SE and the drain electrode DE of the driving transistor T and may be formed simultaneously with them.

The second metal layer VSS1-2 of the first common power line VSS1 may be provided in the same layer as the anode auxiliary electrode 115 provided in the display area DA. The second metal layer VSS1-2 may be made of the same material as that of the anode auxiliary electrode 115 and may be formed simultaneously with the anode auxiliary electrode 115.

In this case, the second metal layer VSS1-2 of the first common power line VSS1 may be connected to the first metal layer VSS1-1 through the fifth contact part CT5 that passes through the first planarization layer PLN1. The fifth contact part CT5 may partially remove the first planarization layer PLN1 and partially expose the upper surface of the first metal layer VSS1-1 of the first common power line VSS1. At this time, the fifth contact part CT5 may expose the upper surface of the first metal layer VSS1-1 of the first common power line VSS1 along the first direction (X axis direction). The second metal layer VSS1-2 of the first common power line VSS1 may directly in contact with the exposed upper surface of the first metal layer VSS1-1 of the first common power line VSS1. As a result, the second metal layer VSS1-2 of the first common power line VSS1 may have a wide contact area with the first metal layer VSS1-1 of the first common power line VSS1, thereby being stably connected to the first metal layer VSS1-1.

In the transparent display panel 110 according to one embodiment of the present disclosure, as the first common power line VSS1 provided in the non-display area NDA is provided as a double layer, a total area of the first common power line VSS1 may be increased, whereby resistance of the first common power line VSS1 may be reduced.

Meanwhile, the first common power line VSS1 may electrically be connected with the second pad VSSP provided in the pad area PA. At this time, the first pixel power line VDD1 and the first reference line VREF1 may be provided between the first common power line VSS1 and the second pad VSSP. If the first common power line VSS1 is formed in the same layer as the first pixel power line VDD1 and the first reference line VREF1, the first common power line VSS1 and the second pad VSSP cannot be formed in the same layer in a single body.

The transparent display panel 110 according to one embodiment of the present disclosure may electrically connect the first common power line VSS1 with the second pad VSSP by using a plurality of connection electrodes disposed over different layers.

In detail, the transparent display panel 110 according to one embodiment of the present disclosure may electrically connect the first common power line VSS1 with the second pad VSSP by using a first common power connection electrode 180 and a second common power connection electrode 185, which are disposed over their respective layers different from each other.

The first common power connection electrode 180 is provided in the first non-display area NDA1. The first common power connection electrode 180 is provided between the first common power line VSS1 and the first substrate 111, and electrically connects the first common power line VSS1 with the second pad VSSP.

For example, the first common power connection electrode 180 may be provided in the same layer as the gate electrode GE of the driving transistor T provided in the display area DA. Also, the first common power connection electrode 180 may be made of the same material as that of the gate electrode GE of the driving transistor T and may be formed simultaneously with the gate electrode GE.

One end of the first common power connection electrode 180 may be connected to the first common power line VSS1 and the other end of the first common power connection electrode 180 may be connected to the second pad VSSP. In detail, the first common power connection electrode 180 may be connected to the first metal layer VSS1-1 of the first common power line VSS1 at one end through an eighth contact hole CH8 that passes through the first and second inter-layer insulating layers ILD1 and ILD2. Also, the first common power connection electrode 180 may be connected to the second pad VSSP at the other end through a ninth contact hole CH9 that passes through the first and second inter-layer insulating layers ILD1 and ILD2.

Meanwhile, the first common power connection electrode 180 may be formed between the second pad VSSP and the first common power line VSS1 as one electrode but is not limited thereto. The first common power connection electrode 180 may include a plurality of electrodes.

For example, the first common power connection electrode 180, as shown in FIG. 10, may include one first common power connection electrode 181, another first common power connection electrode 182, and other first common power connection electrode 183.

One first common power connection electrode 181 may be connected to the first common power line VSS1 through the eighth contact hole CH8, and another first common power connection electrode 182 may be connected to the second pad VSSP through the ninth contact hole CH9. One first common power connection electrode 181 and another first common power connection electrode 182 may be provided in the same layer as the gate electrode GE of the driving transistor T.

One end of the other first common power connection electrode 183 provided over a layer different from one first common power connection electrode 181 and another first common power connection electrode 182 may be connected to the first common power connection electrode 181 through a tenth contact hole CH10, and the other end thereof may be connected to the first common power connection electrode 182 through an eleventh contact hole CH11. At this time, the other first common power connection electrode 183 may be provided in the same layer as the source electrode SE and the drain electrode DE of the driving transistor T.

The second common power connection electrode 185 may be provided in the first non-display area NDA1, and may partially be overlapped with the first common power connection electrode 180. Also, the second common power connection electrode 185 is provided over the first common power line VSS1, and electrically connects the first common power line VSS1 with the second pad VSSP.

For example, the second common power connection electrode 185 may be provided in the same layer as the anode electrode 120 of the light emitting diode provided in the display area DA. Also, the second common power connection electrode 185 may be made of the same material as that of the anode electrode 120 of the light emitting diode and may be formed simultaneously with the anode electrode 120.

One end of the second common power connection electrode 185 may be connected to the first common power line VSS1, and the other end of the second common power connection electrode 185 may be connected to the second pad VSSP. In detail, the second common power connection electrode 185 may be connected to the second metal layer VSS1-2 of the first common power line VSS1 at one end through a first contact part CT1. The first contact part CT1 may partially remove the second planarization layer PLN2 and partially expose the upper surface of the second metal layer VSS1-2 of the first common power line VSS1. At this time, the first contact part CT1 may expose the upper surface of the second metal layer VSS1-2 of the first common power line VSS1 along the first direction (X axis direction). The second common power connection electrode 185 may directly in contact with the exposed upper surface of the first common power line VSS1. As a result, the second common power connection electrode 185 may have a wide contact area with the first common power line VSS1, thereby being stably connected to the first common power line VSS1. Meanwhile, at least a part of the first contact part CT1 may be formed to overlap the fifth contact part CT5.

The second common power connection electrode 185 may be connected to the second pad VSSP at the other end through a second contact part CT2. The second contact part CT2 may partially remove the first planarization layer PLN1 and partially expose the upper surface of the second pad VSSP. The second pad VSSP, as shown in FIG. 2, may include a plurality of pad parts. At this time, two pad parts disposed to adjoin each other may be connected with each other through a pad connection electrode PC. The second contact part CT2 may expose the upper surface of the second pad VSSP connected by the pad connection electrode PC along the first direction (X axis direction). The second common power connection electrode 185 may directly in contact with the exposed upper surface of the second pad VSSP. As a result, the second common power connection electrode 185 may have a wide contact area with the second pad VSSP, thereby being stably connected to the second pad VSSP.

Also, the second common power connection electrode 185 may electrically be connected with the cathode electrode 140 through a cathode contact part CCT in the first non-display area NDA1. The cathode contact part CCT may partially remove the bank 125 and partially expose the upper surface of the second common power connection electrode 185. The cathode contact part CCT may expose the upper surface of the second common power connection electrode 185 along the first direction (X axis direction). As a result, the second common power connection electrode 185 may have a wide contact area with the cathode electrode 140, thereby being stably connected to the cathode electrode 140.

Consequently, the first common power line VSS1 may electrically be connected with the cathode electrode 140 through the second common power connection electrode 185. Therefore, the first common power line VSS1 may supply the second power source forwarded from the second pad VSSP to the cathode electrode 140.

The transparent display panel 110 according to one embodiment of the present disclosure may electrically connect the first common power line VSS1 and the second pad VSSP, which are disposed in the first non-display area NDA1, with each other by using the first common power connection electrode 180 and the second common power connection electrode 185 disposed over their respective layers different from each other. At this time, the first common power connection electrode 180 may be provided below the first common power line VSS1 and the second pad VSSP, and the second common power connection electrode 185 may be provided over the first common power line VSS1 and the second pad VSSP.

Therefore, the transparent display panel 110 according to one embodiment of the present disclosure may increase a total area of the common power line VSS, whereby resistance of the common power line VSS may be reduced.

Also, in the transparent display panel 110 according to one embodiment of the present disclosure, even though a defect occurs in any one of the first common power connection electrode 180 and the second common power connection electrode 185, the first common power line VSS1 and the second pad VSSP may be connected with each other by the other one. Therefore, since the transparent display panel 110 according to one embodiment of the present disclosure may stably supply the first power source to the subpixels P1, P2 and P3, panel yield may be improved.

The second common power line VSS2 may be extended in the second non-display area NDA2 in a first direction (X axis direction). The second common power line VSS2 may electrically be connected with the first common power line VSS1 through the third common power line VSSL.

The second common power line VSS2 may be made of a plurality of metal layers like the first common power line VSS1. For example, the second common power line VSS2 may include a first metal layer and a second metal layer provided over the first metal layer like the first common power line VSS1.

The third common power line VSSL is provided between the transmissive areas TA in the display area DA. At this time, the transparent display panel 110 according to one embodiment of the present disclosure may reduce or minimize the non-transmissive area NTA in the display area DA by alternately disposing the third common power line VSSL and the third pixel power line VDDL between the transmissive areas TA. Therefore, the transparent display panel 110 according to one embodiment of the present disclosure may enhance transmittance by increasing the transmissive area TA.

Meanwhile, the third common power line VSSL may be extended in the display area DA in a second direction (Y axis direction), and thus its one end may be connected with the first common power line VSS1 and its other end may be connected with the second common power line VSS2. For example, the third common power line VSSL and the first common power line VSS1, as shown in FIG. 10, may be provided in the same layer, and may be connected with each other without being spaced apart from each other.

Referring to FIGS. 2, 8 and 11, the first reference line VREF1 may be provided to be extended in the first non-display area NDA1, specifically between the first pixel power line VDD1 and the first common power line VSS1 in a first direction (X axis direction). The first reference line VREF1 may be connected with the third pad VREFP in the first non-display area NDA1, and may be supplied with the initialization voltage (or sensing voltage) from the third pad VREFP. Also, the first reference line VREF1 may be connected with the plurality of second reference lines VREFL disposed in the display area DA, and may supply the initialization voltage (or sensing voltage) to the transistor T of each of the subpixels P1, P2 and P3 through the plurality of second reference lines VREFL.

The first reference line VREF1 may be made of a plurality of metal layers. For example, the first reference line VREF1, as shown in FIG. 11, may include a first metal layer VREF1-1 and a second metal layer VREF1-2 provided over the first metal layer VREF1-1. The first metal layer VREF1-1 and the second metal layer VREF1-2 may partially be overlapped with each other, and may be connected with each other through a twelfth contact hole CH12.

At this time, the first metal layer VREF1-1 of the first reference line VREF1 may be provided in the same layer as the source electrode SE and the drain electrode DE of the driving transistor T provided in the display area DA. The first metal layer VREF1-1 may be made of the same material as that of the source electrode SE and the drain electrode DE of the driving transistor T and may be formed simultaneously with them.

The second metal layer VREF1-2 of the first reference line VREF1 may be provided in the same layer as the anode auxiliary electrode 115 provided in the display area DA. The second metal layer VREF1-2 may be made of the same material as the anode auxiliary electrode 115 and may be formed simultaneously with the anode auxiliary electrode 115. In this case, the second metal layer VREF1-2 of the first reference line VREF1 may be connected to the first metal layer VREF1-1 through the twelfth contact hole CH12 that passes through the first planarization layer PLN1.

In the transparent display panel 110 according to one embodiment of the present disclosure, as the first reference line VREF1 provided in the non-display area NDA is provided as a double layer, a total area of the first reference line VREF1 may be increased, whereby resistance of the first reference line VREF1 may be reduced.

Meanwhile, the first reference line VREF1 may electrically be connected with the third pad VREFP provided in the pad area PA. At this time, the first pixel power line VDD1 may be provided between the first reference line VREF1 and the third pad VREFP. If the first reference line VREF1 is formed in the same layer as the first pixel power line VDD1, the first reference line VREF1 and the third pad VREFP cannot be formed in the same layer in a single body.

The transparent display panel 110 according to one embodiment of the present disclosure may electrically connect the first reference line VREF1 with the third pad VREFP by using a plurality of connection electrodes disposed over different layers.

In detail, the transparent display panel 110 according to one embodiment of the present disclosure may electrically connect the first reference line VREF1 with the third pad VREFP by using a first reference connection electrode 190 and a second reference connection electrode 195, which are disposed over their respective layers different from each other.

The first reference connection electrode 190 is provided in the first non-display area NDA1. The first reference connection electrode 190 is provided between the first reference line VREF1 and the first substrate 111, and electrically connects the first reference line VREF1 with the third pad VREFP.

For example, the first reference connection electrode 190 may be provided in the same layer as the gate electrode GE of the driving transistor T provided in the display area DA. Also, the first reference connection electrode 190 may be made of the same material as that of the gate electrode GE of the driving transistor T and may be formed simultaneously with the gate electrode GE.

One end of the first reference connection electrode 190 may be connected to the first reference line VREF1 and the other end of the first reference connection electrode 190 may be connected to the third pad VREFP. In detail, the first reference connection electrode 190 may be connected to the first metal layer VREF1-1 of the first reference line VREF1 at one end through a thirteenth contact hole CH13 that passes through the first and second inter-layer insulating layers ILD1 and ILD2. Also, the first reference connection electrode 190 may be connected to the third pad VREFP at the other end through a fourteenth contact hole CH14 that passes through the first and second inter-layer insulating layers ILD1 and ILD2.

Meanwhile, the first reference connection electrode 190 may be formed between the first reference line VREF1 and the third pad VREFP as one electrode but is not limited thereto. The first reference connection electrode 190 may include a plurality of electrodes.

The second reference connection electrode 195 may be provided in the first non-display area NDA1. At least a part of the second reference connection electrode 195 may be overlapped with the first reference connection electrode 190. The second reference connection electrode 195 is provided over the first reference line VREF1, and electrically connects the first reference line VREF1 with the third pad VREFP.

For example, the second reference connection electrode 195 may be provided in the same layer as the anode electrode 120 of the light emitting diode provided in the display area DA. Also, the second reference connection electrode 195 may be made of the same material as that of the anode electrode 120 of the light emitting diode and may be formed simultaneously with the anode electrode 120.

One end of the second reference connection electrode 195 may be connected to the first reference line VREF1 and the other end thereof may be connected to the third pad VREFP. In detail, the second reference connection electrode 195 may be connected to the second metal layer VREF1-2 of the first reference line VREF1 at one end through a third contact part CT3. The third contact part CT3 may partially remove the second planarization layer PLN2 and partially expose the upper surface of the second metal layer VREF1-2 of the first reference line VREF1. At this time, the third contact part CT3 may expose the upper surface of the second metal layer VREF1-2 of the first reference line VREF1 along the first direction (X axis direction). As a result, the second reference connection electrode 195 may have a wide contact area with the first reference line VREF1, thereby being stably connected to the first reference line VREF1.

The second reference connection electrode 195 may be connected to the third pad VREFP at the other end through a fourth contact part CT4. The fourth contact part CT4 may partially remove the first planarization layer PLN1 and partially expose the upper surface of the third pad VREFP. At this time, the fourth contact portion CT4 may expose the upper surface of the third pad VREFP along the first direction (X axis direction). The second reference connection electrode 195 may directly in contact with the exposed upper surface of the third pad VREFP. As a result, the second reference connection electrode 195 may have a wide contact area with the third pad VREFP, thereby being stably connected to the third pad VREFP.

The second reference connection electrode 195 is formed in the same layer as the second common power connection electrode 185 but is spaced apart from the second common power connection electrode 185. Therefore, the second reference connection electrode 195 is not electrically connected with the second common power connection electrode 185.

The transparent display panel 110 according to one embodiment of the present disclosure may connect the first reference line VREF1 and the third pad VREFP, which are disposed in the first non-display area NDA1, with each other by using the first reference connection electrode 190 and the second reference connection electrode 195 disposed over their respective layers different from each other. At this time, the first reference connection electrode 190 may be provided below the first reference line VREF1 and the third pad VREFP, and the second reference connection electrode 195 may be provided over the first reference line VREF1 and the third pad VREFP.

Therefore, the transparent display panel 110 according to one embodiment of the present disclosure may increase a total area of the first reference line VREF1, whereby resistance of the first reference line VREF1 may be reduced.

Also, in the transparent display panel 110 according to one embodiment of the present disclosure, even though a defect occurs in any one of the first reference connection electrode 190 and the second reference connection electrode 195, the first reference line VREF1 and the third pad VREFP may be connected with each other by the other one. Therefore, since the transparent display panel 110 according to one embodiment of the present disclosure may stably supply the initialization voltage (or sensing voltage) to the subpixels P1, P2 and P3, panel yield may be improved.

Also, the transparent display panel 110 according to one embodiment of the present disclosure may test a defect of the driving transistor T before the anode electrode 120 is deposited.

In some embodiments, the transparent display panel 110 may connect the first common power line VSS1 with the second pad VSSP by using only the second common power connection electrode 185 provided in the same layer as the anode electrode 120. Also, in some embodiments, the transparent display panel 110 may connect the first reference line VREF1 with the third pad VREFP by using only the second reference connection electrode 195 provided in the same layer as the anode electrode 120.

In this case, a process of testing a defect of the driving transistor T has no choice but to be performed after the anode electrode 120 is deposited. If a defect occurs in the driving transistor T, a repair process may be performed to repair a portion where the defect has occurred. At this time, the layers deposited over the layer where the defect has occurred should be removed to perform the repair process. For example, if the defect occurs in the layer provided with the anode auxiliary electrode 115, the second planarization layer PLN2 and the anode electrode 120 should be removed for the repair process. At this time, luminescence may not be performed in the corresponding area.

In this way, if the repair process is performed after the anode electrode 120 is formed, repair yield is reduced due to the anode electrode 120 and the organic layer PLN2 provided over the anode auxiliary electrode 115, and a tact time is increased.

The transparent display panel 110 according to one embodiment of the present disclosure may connect the first common power line VSS1 with the second pad VSSP by using the first common power connection electrode 180 and the second common power connection electrode 185. Also, the transparent display panel 110 according to one embodiment of the present disclosure may connect the first common power line VSS1 with the second pad VSSP through the first common power connection electrode 180 even though the second common power connection electrode 185 is not formed.

The transparent display panel 110 according to one embodiment of the present disclosure may connect the first reference line VREF1 with the third pad VREFP by using the first reference connection electrode 190 and the second reference connection electrode 195. Also, the transparent display panel 110 according to one embodiment of the present disclosure may connect the first reference line VREF1 with the third pad VREFP through the first reference connection electrode 190 even though the second reference connection electrode 195 is not formed.

In this case, the transparent display panel 110 according to the embodiment of the present disclosure can test the defect of the driving transistor T before depositing the anode electrode 120. That is, the transparent display panel 110 according to the embodiment of the present disclosure can perform a repair process before depositing the second planarization layer PLN2 and the anode electrode 120, so that it is possible to prevent the repair yield from decreasing due to the second planarization layer PLN2 and the anode electrode 120 which would be removed otherwise. In addition, the transparent display panel 110 according to an embodiment of the present disclosure may reduce the tact time.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device, comprising:
   a substrate provided thereon with a display area, in which a plurality of subpixels is disposed, and a non-display area adjacent to the display area;
   anode electrodes provided in each of the plurality of subpixels over the substrate;
   a light emitting layer provided over the anode electrodes;
   a cathode electrode provided over the light emitting layer;
   a pixel power line provided over the substrate and extended in the display area in a first direction;
   a common power line provided over the substrate and extended in the display area in the first direction; and
   a gate line extended in a second direction crossing the common power line and the pixel power line,
   wherein the display area includes a non-transmissive area provided with the common power line and the pixel power line, and a transmissive area that transmits external light and is provided between the common power line and the pixel power line,
   wherein the anode electrodes include a first anode electrode on the common power line, a third anode electrode on the pixel power line, and a second anode electrode provided between the first anode electrode and the third anode electrode, and
   wherein at least a part of the first anode electrode is disposed to overlap a first overlapping area where the common power line and the gate line overlap each other, and at least a part of the third anode electrode is disposed to overlap a second overlapping area where the pixel power line and the gate line overlap each other.

2. The transparent display device of claim 1, wherein the second anode electrode has a shape different from those of the first anode electrode and the third anode electrode.

3. The transparent display device of claim 2, wherein the first anode electrode is provided along the common power line in a plural number, and the third anode electrode is provided along the pixel power line in a plural number, the transparent display device further comprising a spacer provided between the first anode electrodes and between the third anode electrodes.

4. The transparent display device of claim 3, wherein at least a part of the spacer is overlapped with ends of the first anode electrodes and ends of the third anode electrodes.

5. The transparent display device of claim 3, wherein the spacer has a width narrower than that of the non-transmissive area.

6. The transparent display device of claim 2, wherein each of the first anode electrode and the third anode electrode includes a first portion, a second portion protruded from a first side of the first portion, and a third portion protruded from a second side facing the first side of the first portion.

7. The transparent display device of claim 6, wherein the second and third portions of the first anode electrode are provided over the common power line, and the second and third portions of the third anode electrode are provided over the pixel power line.

8. The transparent display device of claim 1, wherein each of the common power line and the pixel power line is provided in a plural number, and the plurality of common power lines and the plurality of pixel power lines are disposed alternately.

9. The transparent display device of claim 1, wherein the cathode electrode is connected to the common power line through a cathode contact portion, and the cathode contact portion is provided in only the non-display area.

10. The transparent display device of claim 1, wherein the cathode electrode includes Ag.

11. A transparent display device, comprising:
    a substrate provided thereon with a display area, in which a plurality of subpixels is disposed, and a non-display area adjacent to the display area;
    a common power line provided over the substrate and extended in the display area in a first direction;
    a pixel power line provided over the substrate and extended in the display area in a first direction;
    a gate line extended in a second direction crossing the common power line and the pixel power line;
    anode electrodes provided in each of the plurality of subpixels over the substrate;
    a bank provided adjacent to the anode electrodes; and
    a spacer provided over the bank,
    wherein the display area includes a non-transmissive area provided with the common power line, and a transmissive area that transmits external light,
    wherein the anode electrodes include a first anode electrode on the common power line, a third anode electrode on the pixel power line, and a second anode electrode provided between the first anode electrode and the third anode electrode, and
    wherein at least a part of the first anode electrode is disposed to overlap a first overlapping area where the common power line and the gate line overlap each other, and at least a part of the third anode electrode is disposed to overlap a second overlapping area where the pixel power line and the gate line overlap each other.

12. The transparent display device of claim 11, wherein each of the first anode electrodes includes a first portion, a second portion protruded from a first side of the first portion, and a third portion protruded from a second side opposite the first side of the first portion.

13. The transparent display device of claim 12, wherein the second and third portions of the first anode electrode are provided over the common power line.

14. The transparent display device of claim 12, wherein at least a part of the spacer is overlapped with an end of the second portion of the first anode electrode and an end of the third portion of the first anode electrode.

15. The transparent display device of claim 11, further comprising:
    a light emitting layer provided over the first anode electrodes; and
    a cathode electrode provided over the light emitting layer,
    wherein the cathode electrode is electrically connected with the common power line through a cathode contact portion, and the cathode contact portion is disposed in the non-display area.

* * * * *